(12) United States Patent
Kim et al.

(10) Patent No.: US 10,297,725 B2
(45) Date of Patent: May 21, 2019

(54) LIGHT EMITTING PACKAGE HAVING PHOSPHOR LAYER OVER A TRANSPARENT RESIN LAYER

(71) Applicant: LG INNOTEK CO., LTD., Seoul (KR)

(72) Inventors: Ki Seok Kim, Seoul (KR); Won Jung Kim, Seoul (KR); June O Song, Seoul (KR); Chang Man Lim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 15/759,113

(22) PCT Filed: Sep. 29, 2017

(86) PCT No.: PCT/KR2017/011089
§ 371 (c)(1),
(2) Date: Mar. 9, 2018

(65) Prior Publication Data
US 2019/0088824 A1 Mar. 21, 2019

(30) Foreign Application Priority Data
Sep. 29, 2017 (KR) .......... 10-2017-0119047

(51) Int. Cl.
*H01L 29/08* (2006.01)
*H01L 21/00* (2006.01)
(Continued)

(52) U.S. Cl.
CPC .......... *H01L 33/486* (2013.01); *H01L 33/505* (2013.01); *H01L 33/507* (2013.01);
(Continued)

(58) Field of Classification Search
CPC ... H01L 33/486; H01L 33/505; H01L 33/507; H01L 33/54; H01L 33/56; H01L 33/60
See application file for complete search history.

(56) References Cited

U.S. PATENT DOCUMENTS 9,035,340 B2 * 5/2015 Kim .................. C09K 11/7734
257/100
2004/0211970 A1 10/2004 Hayashimoto et al.
(Continued)

FOREIGN PATENT DOCUMENTS

EP  2 535 954 A1  12/2012
JP  2007-150228 A  6/2007
(Continued)

*Primary Examiner* — Alonzo Chambliss
(74) *Attorney, Agent, or Firm* — Birch, Stewart, Kolasch & Birch, LLP

(57) ABSTRACT

The embodiment relates to a semiconductor device package, a method of manufacturing the semiconductor device package, and a light source apparatus.
According to another embodiment, there is provided a light emitting device package which includes a package body (110) including a frame (111, 112) and a body (113); a light emitting device (120) including first and second bonding parts (121, 122) and disposed on the body (113); a reflective resin layer disposed between the light emitting device and a side surface of a cavity (C) formed in the body; a transparent resin layer on the light emitting device; and a phosphor layer disposed on the transparent resin layer while being spaced apart from the light emitting device.

14 Claims, 11 Drawing Sheets

(51) Int. Cl.
*H01L 33/48* (2010.01)
*H01L 33/62* (2010.01)
*H01L 33/60* (2010.01)
*H01L 33/54* (2010.01)
*H01L 33/50* (2010.01)
*H01L 33/56* (2010.01)

(52) U.S. Cl.
CPC .............. *H01L 33/54* (2013.01); *H01L 33/56* (2013.01); *H01L 33/60* (2013.01); *H01L 33/62* (2013.01); *H01L 2933/005* (2013.01); *H01L 2933/0041* (2013.01); *H01L 2933/0058* (2013.01); *H01L 2933/0066* (2013.01); *H01L 2933/0091* (2013.01)

(56) References Cited

U.S. PATENT DOCUMENTS

| | | | | |
|---|---|---|---|---|
| 2007/0012940 A1* | 1/2007 | Suh | ............. | H01L 33/507 257/99 |
| 2008/0149962 A1* | 6/2008 | Kim | ............. | H01L 25/167 257/99 |
| 2008/0191227 A1 | 8/2008 | Kimura et al. | | |
| 2013/0001614 A1* | 1/2013 | Lo | ............. | H01L 33/42 257/98 |
| 2013/0037842 A1 | 2/2013 | Yamada et al. | | |
| 2013/0307000 A1 | 11/2013 | Ikenaga et al. | | |
| 2014/0021503 A1* | 1/2014 | Yoshida | ............. | H01L 33/507 257/98 |
| 2015/0179878 A1* | 6/2015 | Park | ............. | H01L 21/02458 257/13 |
| 2015/0236203 A1 | 8/2015 | Oh et al. | | |
| 2015/0301259 A1* | 10/2015 | Park | ............. | G02B 6/0026 349/65 |
| 2017/0324003 A1 | 11/2017 | Kim et al. | | |

FOREIGN PATENT DOCUMENTS

| | | |
|---|---|---|
| KR | 10-2008-0057876 A | 6/2008 |
| KR | 10-2013-0103135 A | 9/2013 |
| KR | 10-2015-0144971 A | 12/2015 |
| KR | 10-2017-0017150 A | 2/2017 |

* cited by examiner

【FIG. 1】
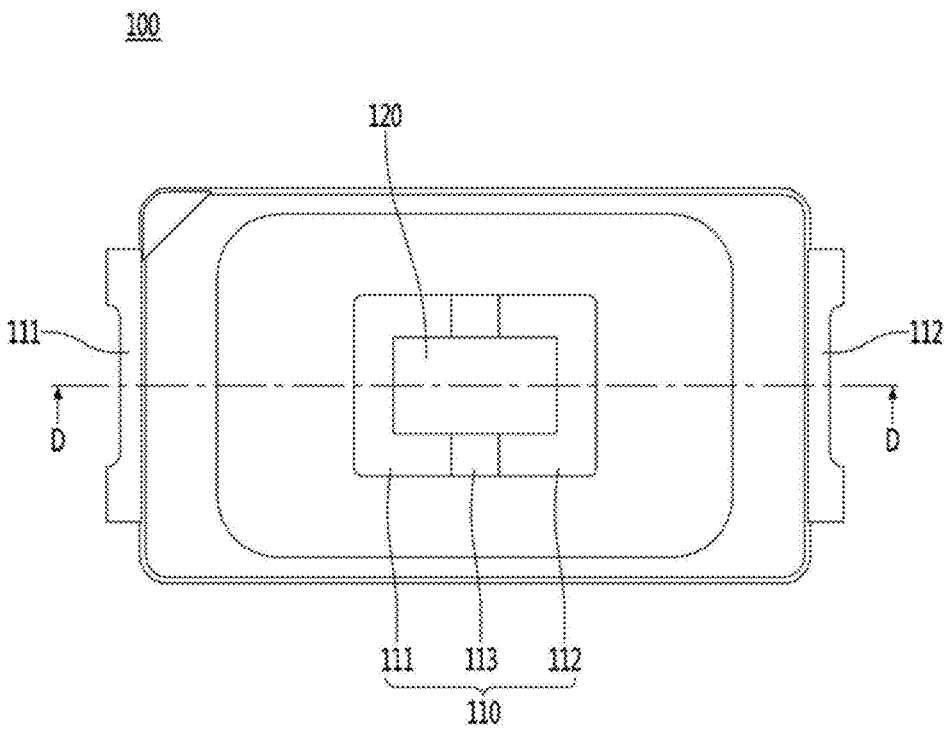
【FIG. 2】
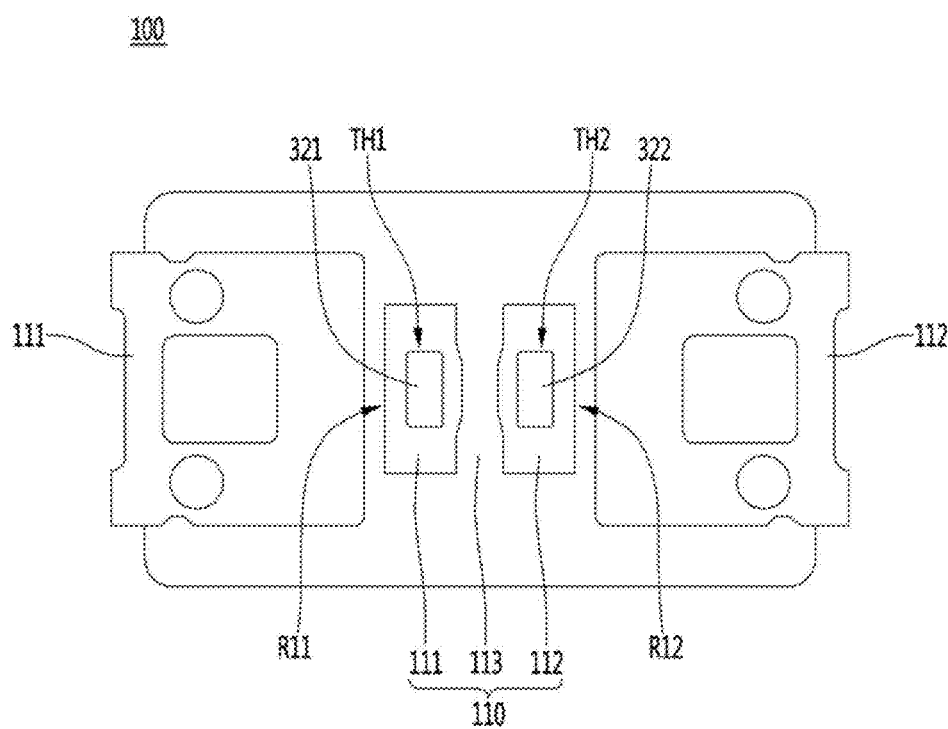

[FIG. 3]
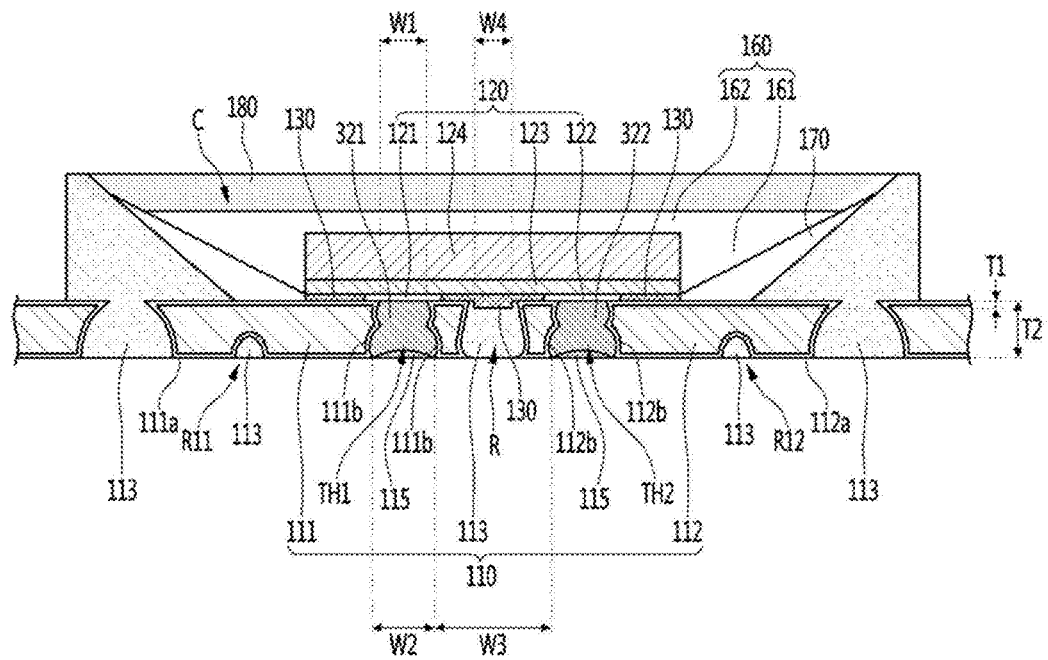
[FIG. 4]
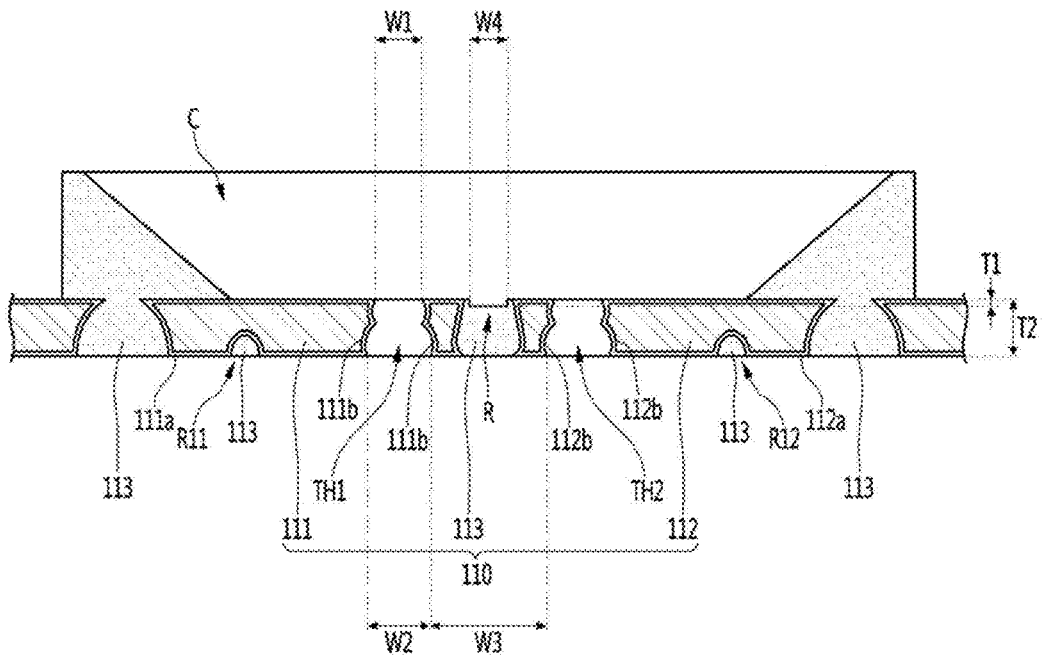

【FIG. 5】
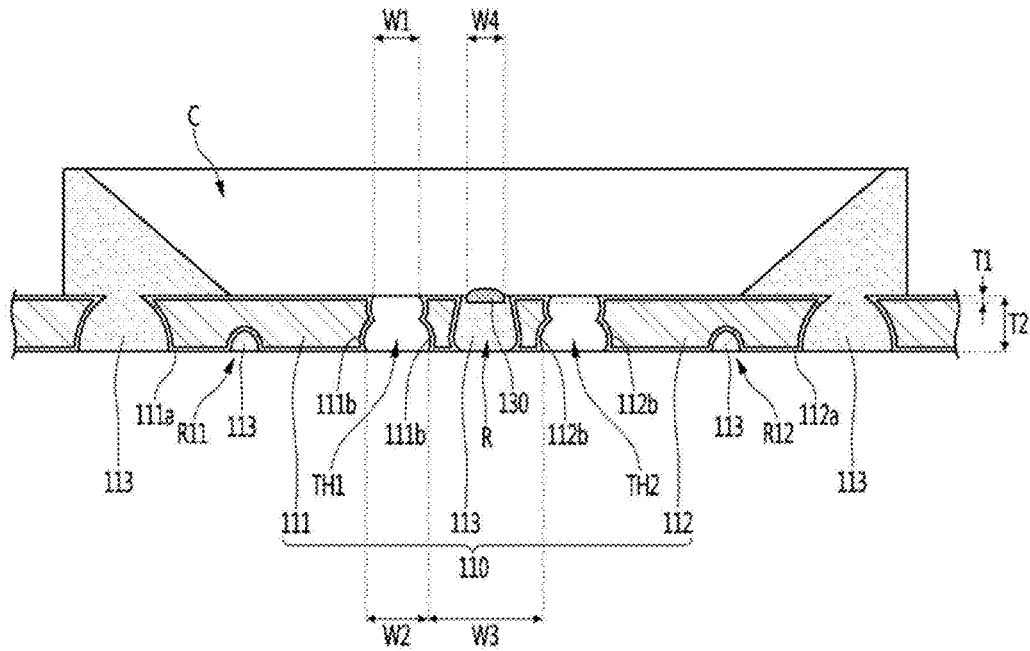
【FIG. 6】
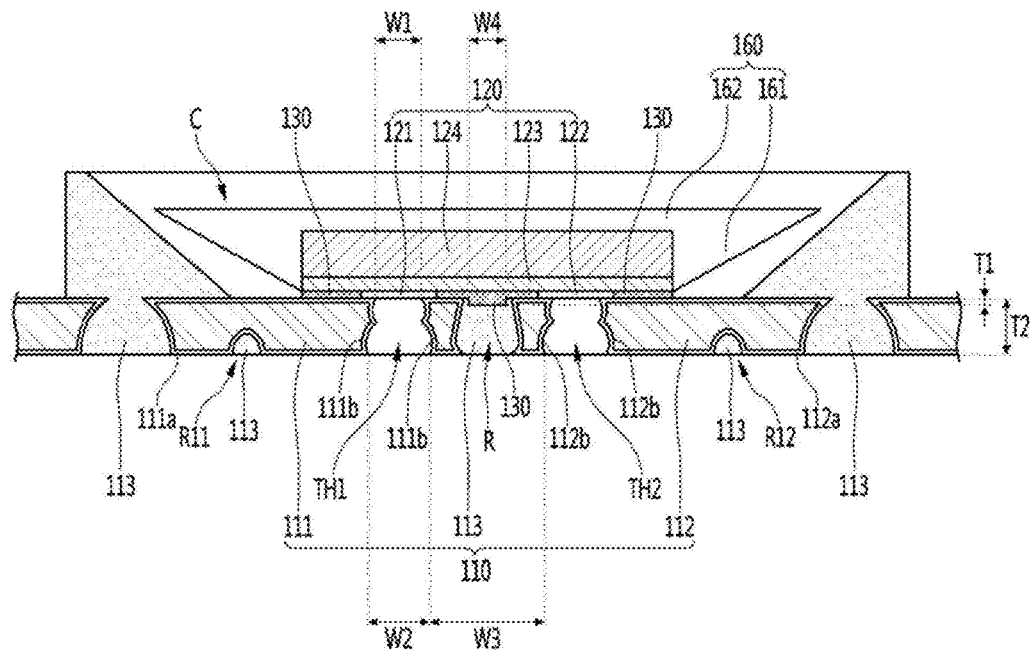

[FIG. 7a]
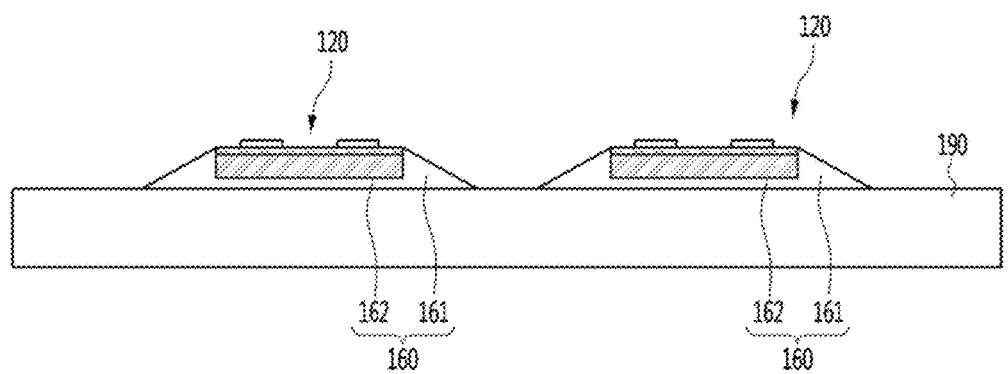
[FIG. 7b]
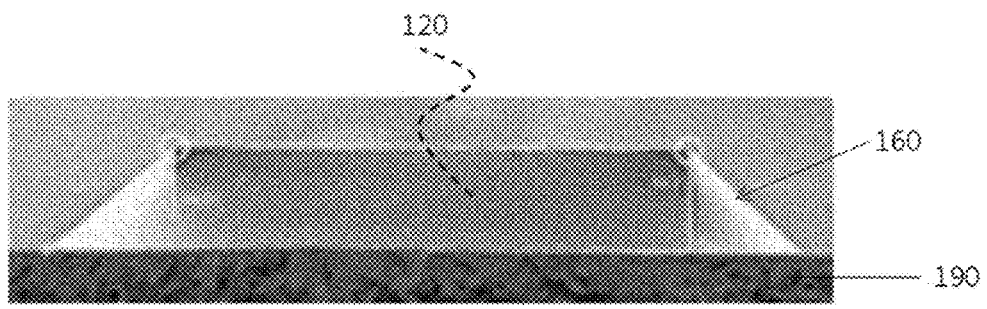

[FIG. 8]
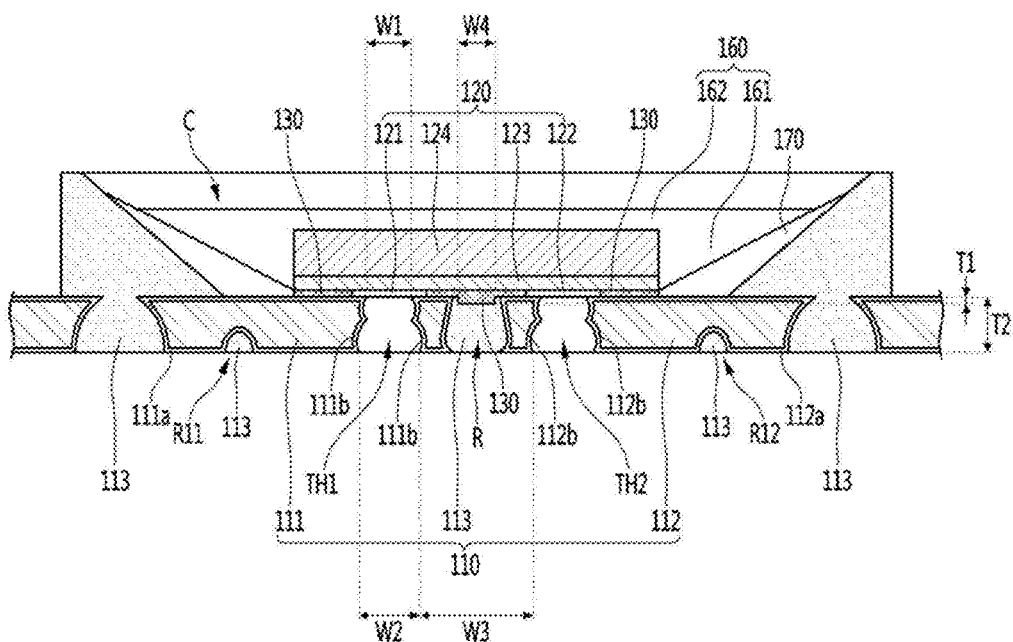

[FIG. 9]
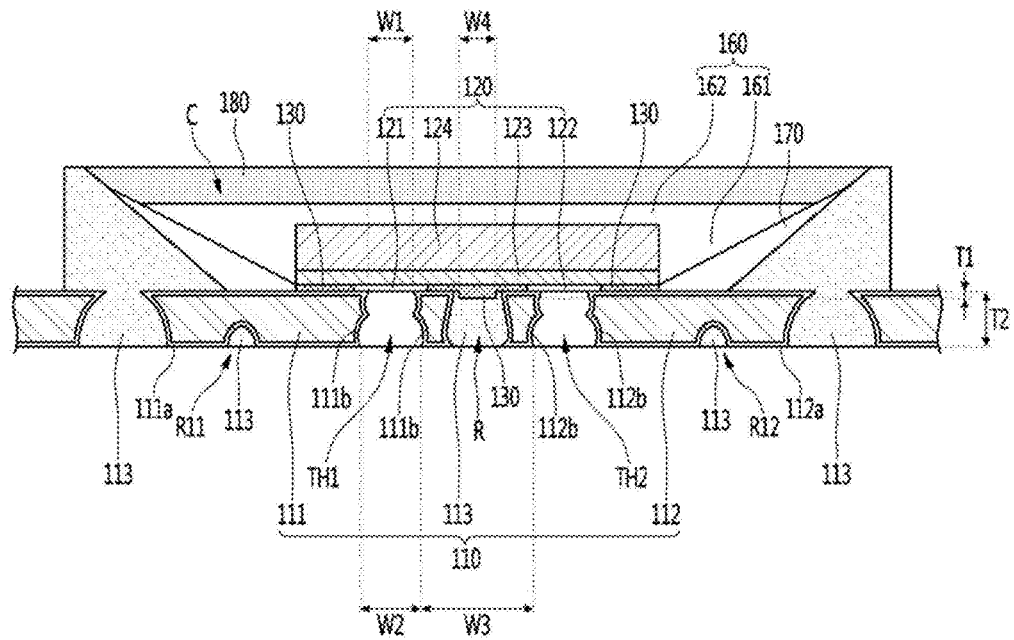
[FIG. 10]
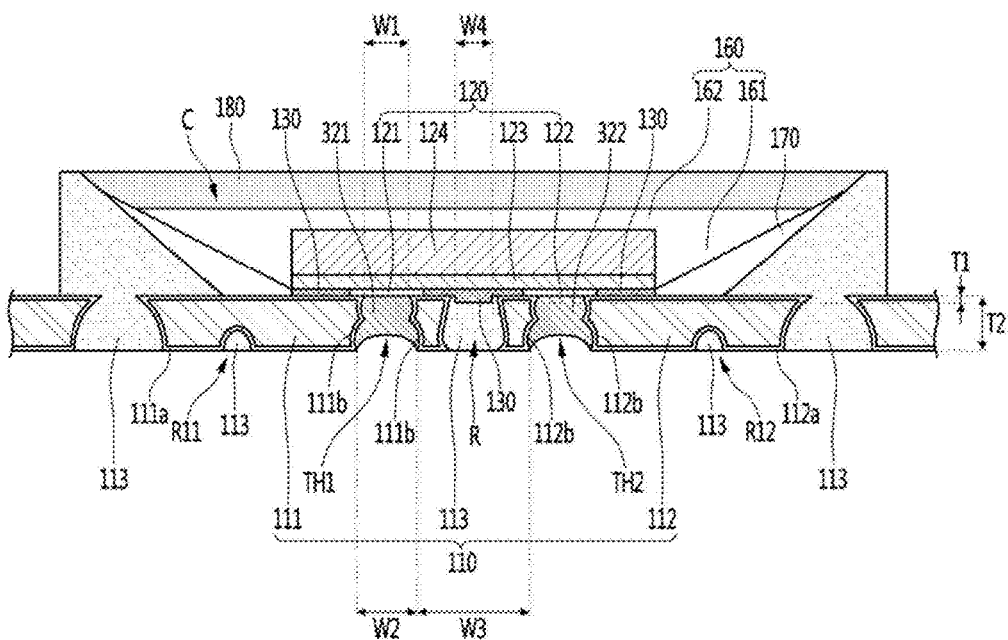

[FIG. 11]
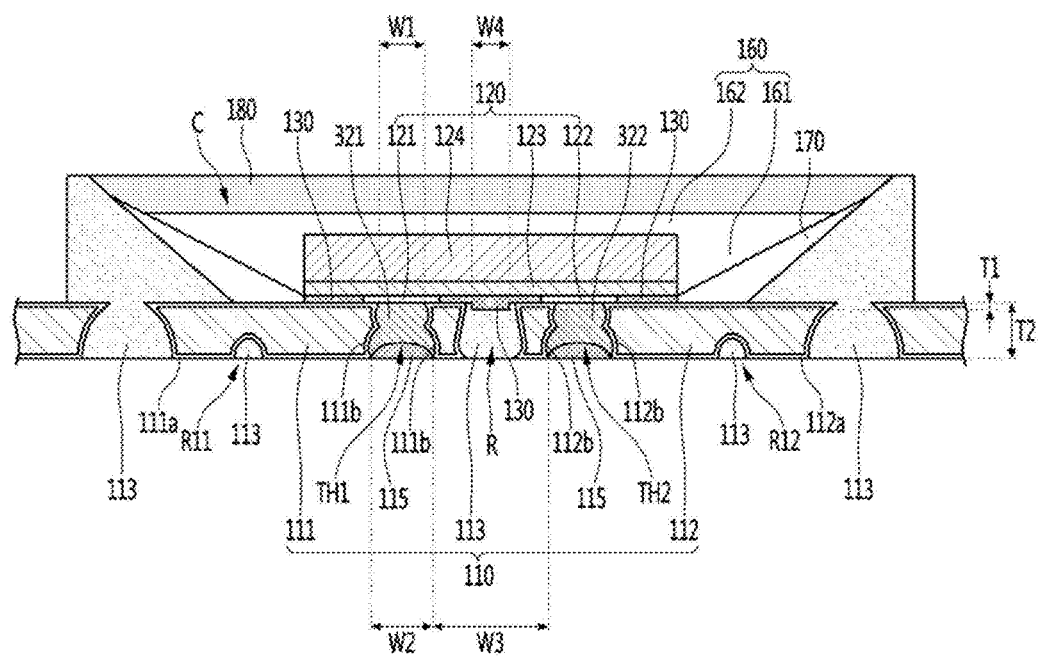

[FIG. 12]
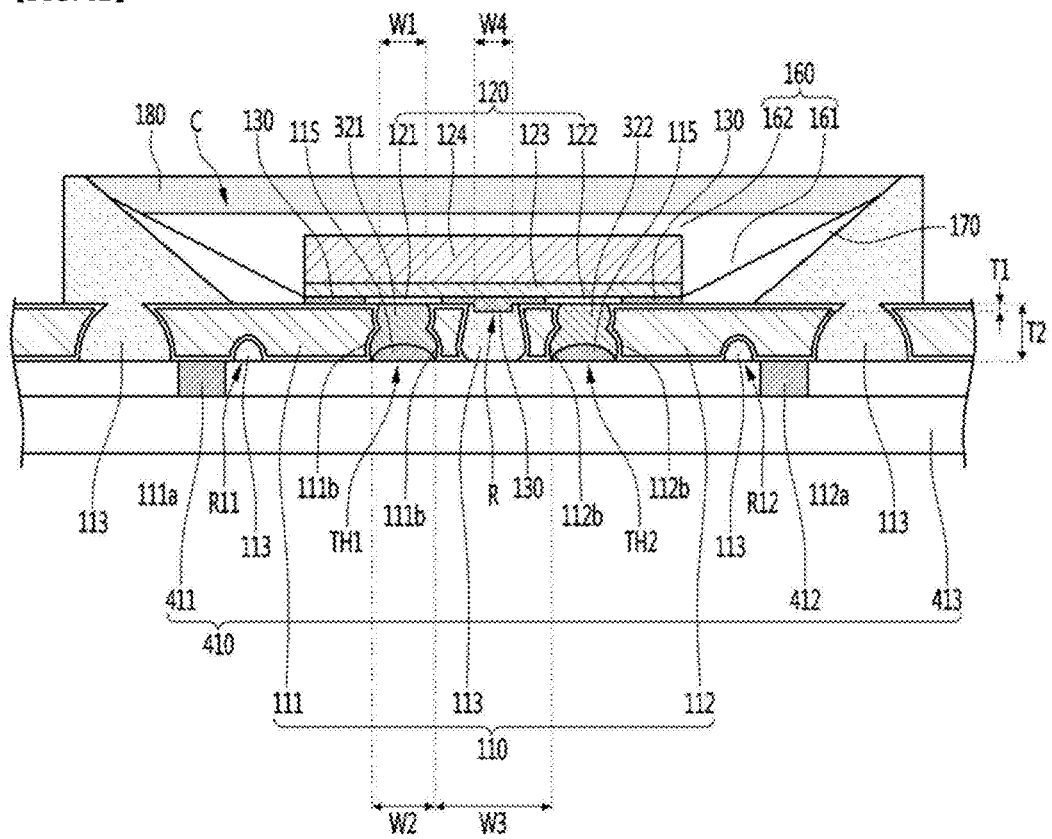

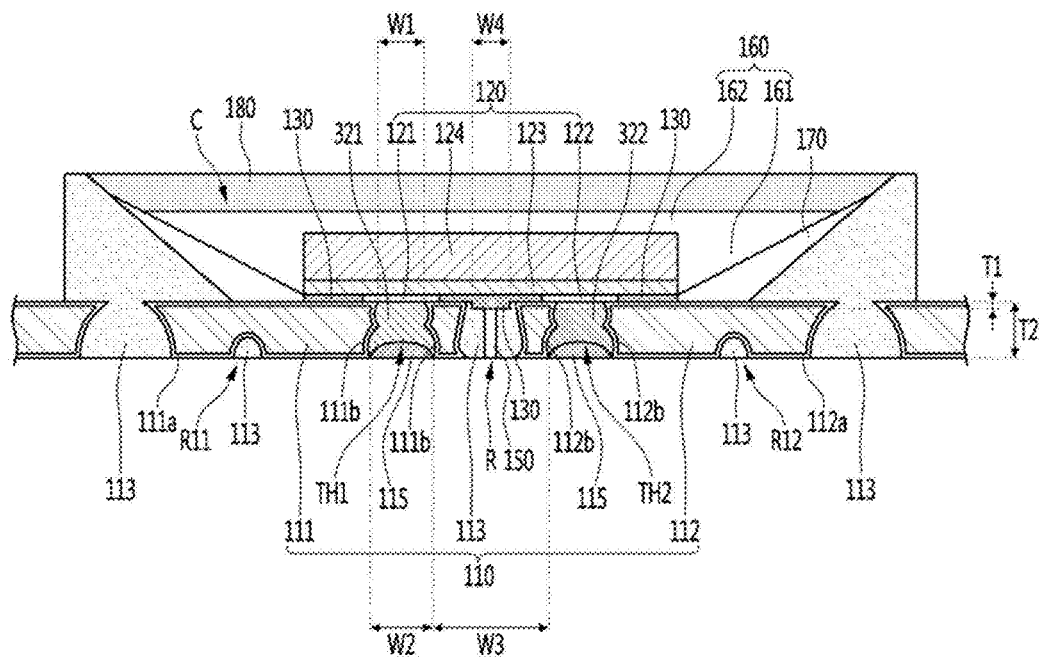
[FIG. 13]
[FIG. 14]

[FIG. 15]
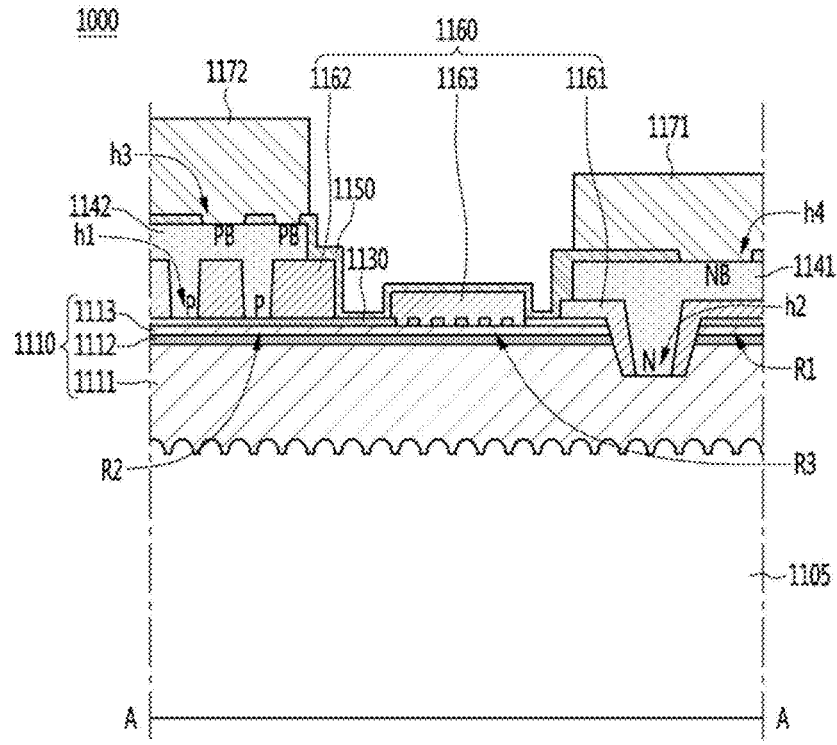
[FIG. 16]
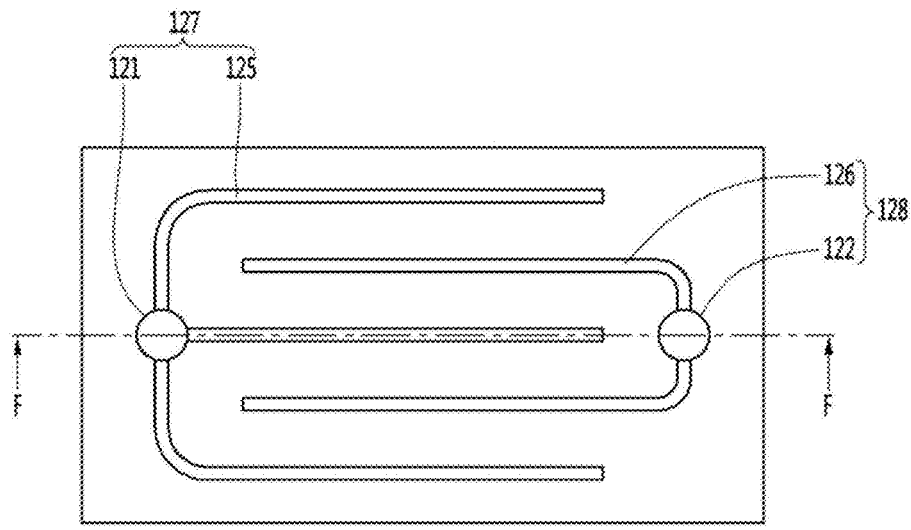

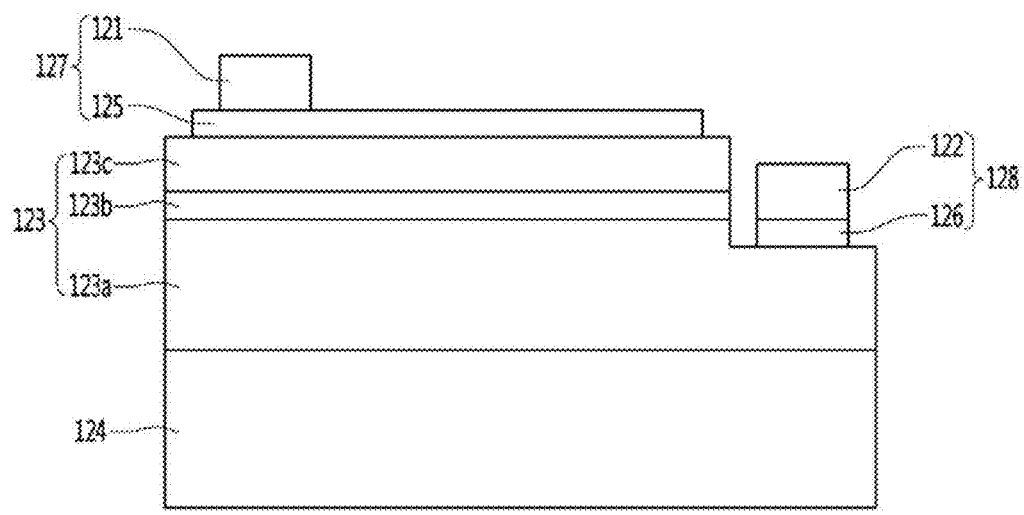
[FIG. 17]

LIGHT EMITTING PACKAGE HAVING PHOSPHOR LAYER OVER A TRANSPARENT RESIN LAYER

CROSS REFERENCE TO RELATED APPLICATIONS

This application is the National Phase of PCT International Application No. PCT/KR2017/011089, filed on Sep. 29, 2017, which claims priority under 35 U.S.C. 119(a) to Patent Application No. 10-2017-0119047, filed in the Republic of Korea on Sep. 15, 2017, all of which are hereby expressly incorporated by reference into the present application.

TECHNICAL FIELD

The embodiment relates to a semiconductor device package, a method of manufacturing the semiconductor device package, and a light source apparatus.

BACKGROUND ART

A semiconductor device including compounds such as GaN and AlGaN has many merits such as wide and easily adjustable bandgap energy, so the device can be used variously as light emitting devices, light receiving devices and various kinds of diodes.

In particular, light emitting devices such as light emitting diodes and laser diodes obtained by using group III-V or group II-VI compound semiconductor substances can implement light having various wavelength band such as red, green, blue and ultraviolet rays due to the development of thin film growth technology and device materials. In addition, the light emitting devices such as light emitting diodes and laser diodes obtained by using group III-V or group II-VI compound semiconductor substances can implement a white light source having high efficiency by using fluorescent substances or combining colors. Such a light emitting device has advantages such as low power consumption, semi-permanent lifetime, quick response speed, safety, and environmental friendliness compared to conventional light sources such as fluorescent lamps and incandescent lamps.

In addition, when a light receiving device such as a photodetector or a solar cell is manufactured using the group III-V or group II-VI compound semiconductor substances, a photoelectric current is generated by absorbing light having various wavelength domains with the development of device materials, so that light having various wavelength domains such as from gamma rays to radio waves can be used. In addition, the above light receiving device has advantages such as quick response speed, safety, environmental friendliness and easy control of device materials, so that the light receiving device can be easily used for a power control, a super-high frequency circuit or a communication module.

Accordingly, the semiconductor device has been applied and expanded to a transmission module of an optical communication tool, a light emitting diode backlight replacing a cold cathode fluorescence lamp (CCFL) constituting a backlight of a liquid crystal display (LCD), a white light emitting diode lighting apparatus replaceable with a fluorescent lamp or an incandescent bulb, a vehicular headlight, a traffic light and a sensor for detecting gas or fire. In addition, the applications of the semiconductor device can be expanded to a high frequency application circuit, a power control apparatus, or a communication module.

For example, the light emitting device may be provided as a p-n junction diode having a characteristic in which electrical energy is converted into light energy by using a group III-V element or a group II-VI element in the periodic table, and various wavelengths can be realized by adjusting the composition ratio of the compound semiconductor substances.

For example, since a nitride semiconductor has high thermal stability and wide bandgap energy, it has received great attention in the field of development of optical devices and high power electronic devices. Particularly, a blue light emitting device, a green light emitting device, an ultraviolet (UV) light emitting device, and a red light emitting device using the nitride semiconductor are commercialized and widely used.

For example, the ultraviolet light emitting device refers to a light emitting diode that generates light distributed in a wavelength range of 200 nm to 400 nm. In the above wavelength range, a short wavelength may be used for sterilization, purification or the like and a long wavelength may be used for a stepper, a curing apparatus or the like.

Ultraviolet rays may be classified into UV-A (315 nm to 400 nm), UV-B (280 nm to 315 nm) and UV-C (200 nm to 280 nm) in an order of the long wavelength. The UV-A (315 nm to 400 nm) domain is applied to various fields such as industrial UV curing, curing of printing ink, exposure machine, discrimination of counterfeit money, photocatalytic sterilization, special lighting (such as aquarium/agriculture), the UV-B (280 nm to 315 nm) domain is applied to medical use, and the UV-C (200 nm to 280 nm) domain is applied to air purification, water purification, sterilization products and the like.

Meanwhile, according to the related art, a light emitting device package includes a light conversion layer, for example, a phosphor layer so that the light emitting package can produce various colors.

Meanwhile, according to the related art, when the phosphor layer is adjacent to the light emitting device, since the light conversion performance of the phosphor layer is deteriorated due to the deterioration of the phosphor layer, a technology (so-called remote phosphor technology) for disposing the phosphor layer to be spaced apart from the light emitting device has been studied.

In addition, in the related art, while a technique of arranging a reflective layer in a cavity of a light emitting device package for improving brightness has been studied, there has been a research result that luminance is greatly improved when the reflective layer technology and the remote phosphor technology are combined organically.

However, according to the related art, because there is a technical difficulty in uniformly arranging the reflective layer in the light emitting device package around the light emitting device, there is a limit in improving the luminance.

In addition, as a semiconductor device capable of providing a high power is requested, although a semiconductor device capable of increasing a power by applying a high power source has been studied, a proper solution has not been available yet.

In addition, as for a semiconductor device package, studies on a method of improving the light extraction efficiency of a semiconductor device and improving the light intensity in a package stage has been proceeding.

In addition, as for the semiconductor device package, studies on a method of improving bonding strength between a package electrode and a semiconductor device has been proceeding.

In addition, as for the semiconductor device package, studies on a method of reducing the manufacturing cost and improving the manufacturing yield by improving the process efficiency and changing the structure has been proceeding.

DETAIL DESCRIPTION OF THE INVENTION

Technical Problem

An embodiment provides a light emitting device package, a method of manufacturing a light emitting device package, and a light source unit capable of improving the luminance of a light emitting device package.

The embodiments may provide a semiconductor device package capable of improving the light extraction efficiency and electrical characteristics, a method of manufacturing the semiconductor device package, and a light source apparatus.

The embodiments may provide a semiconductor device package capable of reducing the manufacturing cost and improving the manufacturing yield, a method of manufacturing the semiconductor device package, and a light source apparatus.

Embodiments provide a semiconductor device package and a method of manufacturing a semiconductor device package that may prevent a re-melting phenomenon from occurring in a bonding region of the semiconductor device package during a process of re-bonding the semiconductor device package to a substrate or the like.

Technical Solution

According to one embodiment, there is provided a light emitting device package which includes a first frame including a first through-hole; a second frame spaced apart from the first frame and including a second through-hole; a body supporting the first and second frames and including a cavity; a light emitting device disposed in the cavity; an adhesion layer disposed between the body and the light emitting device; a reflection layer disposed on a side surface of the cavity; a transparent layer disposed on the reflection layer and surrounding the light emitting device; and a phosphor layer disposed on the transparent layer, wherein the first and second through-holes overlap the light emitting device, the body includes a recess between the first and second through-holes, and the adhesion layer is disposed in the recess.

The transparent layer may be a transparent resin layer. The reflection layer may be a reflective resin layer.

In addition, according to another embodiment, there is provided a light emitting device package which includes a package body (110) including a frame (111 and 112) and a body (113); a light emitting device (120) including first and second bonding parts (121 and 122) and disposed on the body (113); a reflective resin layer (170) disposed between the light emitting device (120) and a side surface of a cavity (C) formed in the body (113); a transparent resin layer (160) on the light emitting device (120); and a phosphor layer (180) disposed on the transparent resin layer (160) while being spaced apart from the light emitting device (160).

According to still another embodiment, there is provided a lighting apparatus including the light emitting device package.

Advantageous Effects

According to the embodiments, it is possible to provide a light emitting device package, a method of manufacturing a light emitting device package, and a light source unit capable of greatly improving luminance by uniformly disposing the reflection layer around a light emitting device in a light emitting device package.

The semiconductor device package and the method of manufacturing the semiconductor device package according to the embodiment can improve light extraction efficiency, electrical characteristics and reliability.

The semiconductor device package and the method of manufacturing the semiconductor device package according to the embodiment can improve the process efficiency and propose a new package structure, thereby reducing manufacturing cost and improving manufacturing yield.

According to embodiments, the semiconductor device package is provided with a body having high reflectance, so that a reflector can be prevented from being discolored, thereby improving reliability of the semiconductor device package.

According to embodiments, the semiconductor device package and the method of manufacturing a semiconductor device can prevent a re-melting phenomenon from occurring in a bonding region of the semiconductor device package during a process of re-bonding the semiconductor device package to a substrate or the like.

DESCRIPTION OF DRAWINGS

FIG. 1 is a plan view showing a light emitting device package according to an embodiment of the present invention.

FIG. 2 is a bottom view showing a light emitting device package shown in FIG. 1.

FIG. 3 is a sectional view taken along the line D-D of the light emitting device package shown in FIG. 1.

FIGS. 4 to 11 are views describing a method of manufacturing a light emitting device package according to an embodiment of the present invention.

FIG. 12 is a view showing a light emitting device package according to an embodiment of the present invention disposed on a printed circuit board.

FIG. 13 is a view showing another example of a light emitting device package according to an embodiment of the present invention.

FIG. 14 is a plan view describing a light emitting device applied to a light emitting device package according to an embodiment of the present invention.

FIG. 15 is a sectional view taken along the line A-A of the light emitting device shown in FIG. 14.

FIG. 16 is a plan view describing another example of a light emitting device applied to a light emitting device package according to an embodiment of the present invention.

FIG. 17 is a sectional view taken along the line F-F of a light emitting device shown in FIG. 16.

MODE FOR INVENTION

Hereinafter, detailed embodiments to solve the reffered problem will be described with reference to the accompanying drawings.

In the description of embodiments, it will be understood that when each element is referred to as being 'on' or 'under' another layer or substrate, it can be directly on or under another layer or substrate, or one or more intervening layers may also be present. In addition, it will be understood that when each element is referred to as being 'on' or 'under' another layer or substrate, it can be upper direction or down direction based on the element.

The semiconductor device can comprise an electrical device such as a light emitting device, or a light receiving device, etc, and the light emitting device and the light receiving device can comprise a first conductivity type semiconductor layer, an active layer and a second conductivity type semiconductor layer.

According to an embodiment, the semiconductor device can be a light emitting device.

The light emitting device can emit a light by recombination of electron and hole, the wavelength of the light is dependent on an energy band gap of characteristic material. Therefore, emitted light can be different according to the composition of the material.

Embodiment

FIG. 1 is a plan view showing a light emitting device package according to an embodiment of the present invention, FIG. 2 is a bottom view showing the light emitting device package shown in FIG. 1, and FIG. 3 is a sectional view showing the light emitting device package taken along line D-D of FIG. 1.

According to an embodiment, as shown in FIG. 1, a light emitting device package 100 may include a package body 110 and a light emitting device 120.

The package body 110 may include a first frame 111 and a second frame 112.

The package body 110 may include a body 113. The body 113 may be disposed between the first frame 111 and the second frame 112. The body 113 may function as a sort of an electrode separation line. The body 113 may be also referred to as an insulating member.

As shown in FIG. 2, according to an embodiment, the light emitting device package 100 may include a first lower recess R11 and a second lower recess R12. The first lower recess R11 and the second lower recess R12 may be spaced apart from each other.

The first lower recess R11 may be provided in a lower surface of the first frame 111. The first lower recess R11 may be concavely provided from the lower surface toward an upper surface of the first frame 111. The first lower recess R11 may be spaced apart from the first opening part TH1.

Also, the second lower recess R12 may be provided in a lower surface of the second frame 112. The second lower recess R12 may be concavely provided from the lower surface toward an upper surface of the second frame 112. The second lower recess R12 may be spaced apart from the second opening part TH2.

First and second conductive layers 321 and 322 can be disposed on the first and second lower recess R11, R12 respectively.

FIG. 3 is a sectional view taken along the line D-D of the light emitting device package shown in FIG. 1 and FIGS. 4 to 11 are views describing a method of manufacturing a light emitting device package according to an embodiment of the present invention.

Hereinafter, the following description will be focused on FIG. 3 and if necessary, the following description refers to FIGS. 4 to 11.

<Package Body (Body, First Frame, Second Frame), Light Emitting Device>

According to an embodiment, as shown in FIG. 3, a light emitting device package 100 may include a package body 110 and a light emitting device 120.

As shown in FIG. 3, the package body 110 may include a first frame 111 and a second frame 112. The first frame 111 and the second frame 112 may be spaced apart from each other.

The package body 110 may include a body 113. The body 113 may be disposed between the first frame 111 and the second frame 112. The body 113 may function as a sort of an electrode separation line. The body 113 may be also referred to as an insulating member.

The body 113 may be disposed on the first frame 111. In addition, the body 113 may be disposed on the second frame 112.

The body 113 may be provided with an inclined surface disposed on the first frame 111 and the second frame 112. Due to the inclined surface of the body 113, a cavity C may be provided over the first frame 111 and the second frame 112.

According to an embodiment, the package body 110 may have a structure provided with the cavity C, or may have a structure provided with a flat upper surface without the cavity C.

For example, the body 113 may be formed of a material selected from the group consisting of polyphthalamide (PPA), polychloro tri phenyl (PCT), liquid crystal polymer (LCP), polyamide9T (PA9T), silicone, an epoxy molding compound (EMC), a silicone molding compound (SMC), ceramic, a photo sensitive glass (PSG), a sapphire ($Al_2O_3$), and the like. In addition, the body 113 may include a high refractive filler such as $TiO_2$ and $SiO_2$.

The first frame 111 and the second frame 112 may be conductive frames. The first frame 111 and the second frame 112 may provide stable the structural strength to the package body 110, and may be electrically connected to the light emitting device 120.

As shown in FIG. 3, according to the embodiment, the light emitting device 120 may include a first bonding part 121, a second bonding part 122, a light emitting structure 123, and a substrate 124.

The light emitting structure 123 may include a first conductive semiconductor layer, a second conductive semiconductor layer, and an active layer disposed between the first conductive semiconductor layer and the second conductive semiconductor layer. The first bonding part 121 may be electrically connected to the first conductive semiconductor layer. In addition, the second bonding part 122 may be electrically connected to the second conductive semiconductor layer.

The light emitting device 120 may be disposed over the package body 110. The light emitting device 120 may be disposed over the first frame 111 and the second frame 112. The light emitting device 120 may be disposed in the cavity C provided by the package body 110.

The first bonding part 121 may be disposed on a lower surface of the light emitting device 120. The second bonding part 122 may be disposed on the lower surface of the light emitting device 120. The first bonding part 121 and the second bonding part 122 may be spaced apart from each other on the lower surface of the light emitting device 120.

The first bonding part 121 may be disposed on the first frame 111. The second bonding part 122 may be disposed on the second frame 112.

The first bonding part 121 may be disposed between the light emitting structure 123 and the first frame 111. The second bonding part 122 may be disposed between the light emitting structure 123 and the second frame 112.

The first bonding part 121 and the second bonding part 122 may be provided in a single layer or multiple layers using at least one material or an alloy selected from the group including Ti, Al, In, Ir, Ta, Pd, Co, Cr, Mg, Zn, Ni, Si, Ge, Ag, Ag alloy, Au, Hf, Pt, Ru, Rh, ZnO, IrOx, RuOx, NiO, RuOx/ITO, Ni/IrOx/Au, and Ni/IrOx/Au/ITO.

Meanwhile, as shown in FIGS. 3 to 4, the light emitting device package 100 according to the embodiment may include a first opening part TH1 and a second opening part TH2. The first frame 111 may include the first opening part TH1. The second frame 112 may include the second opening part TH2.

The first opening part TH1 may be provided in the first frame 111. The first opening part TH1 may be provided through the first frame 111. The first opening part TH1 may be provided through an upper surface and a lower surface of the first frame 111 in a first direction.

As shown in FIG. 3, the first opening part TH1 may be arranged under the first bonding part 121 of the light emitting device 120. The first opening part TH1 may overlap with the first bonding part 121 of the light emitting device 120. The first opening part TH1 may overlap with the first bonding part 121 of the light emitting device 120 in the first direction, which is directed from the upper surface toward the lower surface of the first frame 111. The first bonding part 121 may be disposed on the first opening part TH1.

The second opening part TH2 may be provided in the second frame 112. The second opening part TH2 may be provided through the second frame 112. The second opening part TH2 may be provided through an upper surface and a lower surface of the second frame 112 in the first direction.

The second opening part TH2 may be arranged under the second bonding part 122 of the light emitting device 120. The second opening part TH2 may overlap with the second bonding part 122 of the light emitting device 120. The second opening part TH2 may overlap with the second bonding part 122 of the light emitting device 120 in the first direction, which is directed from the upper surface toward the lower surface of the second frame 112. The second bonding part 122 may be disposed on the second opening part TH2.

The first opening part TH1 and the second opening part TH2 may be spaced apart from each other. The first opening part TH1 and the second opening part TH2 may be spaced apart from each other under the lower surface of the light emitting device 120.

According to the embodiment, the width W1 of an upper region of the first opening part TH1 may be less than or equal to the width of the first bonding part 121. In addition, the width of an upper region of the second opening part TH2 may be less than or equal to the width of the second bonding part 122.

Therefore, the first bonding part 121 of the light emitting device 120 can be attached to the first frame 111 more firmly. In addition, the second bonding part 122 of the light emitting device 120 can be attached to the second frame 112 more firmly.

In addition, the width W1 of the upper region of the first opening part TH1 may be less than or equal to the width W2 of a lower region of the first opening part TH1. In addition, the width of the upper region of the second opening part TH2 may be less than or equal to the width of a lower region of the second opening part TH2.

A first opening TH1 may include an upper region arranged adjacent to an upper surface of a first frame 111 and a lower region arranged adjacent to a lower surface of the first frame 111. For example, a periphery of the upper region of the first opening TH1 may be smaller than a periphery of the lower region of the first opening TH1.

The first opening TH1 includes a first point having a smallest periphery in a first direction and the first point may be closer to the upper region of the first opening than the upper region of the first opening TH1 based on a direction perpendicular to the first direction.

In addition, the first opening TH2 may include an upper region arranged adjacent to an upper surface of a second frame 112 and a lower region arranged adjacent to a lower surface of the second frame 1121. For example, a periphery of the upper region of the second opening TH2 may be smaller than a periphery of the lower region of the second opening TH2.

The second opening TH2 includes a first point where the second opening has a smallest periphery in the first direction and the first point may be closer to the upper region of the second opening Th2 than the upper region of the second opening TH2 based on the direction perpendicular to the first direction.

FIG. 4 shows the case that the light emitting device package is etched in the top and bottom directions of first and second lead frames 111 and 112, respectively, in the process of forming the first and second openings TH1 and TH2.

As etching processes are separately performed in the top and bottom directions of the first and second lead frames 111 and 112, the first and second openings TH1 and TH2 may be provided in a shape of a snowman.

Each width of the first and second openings TH1 and TH2 may gradually increase and then decrease again from the lower region to a middle region thereof. In addition, the width may gradually increase and then decrease again to the upper region from the middle region where the width is decreased.

The aforementioned first point of the first and second openings TH1 and TH2 may denote a boundary region in which the size of the opening in the snowman shape decreases and then increases again from the lower region to the upper region.

The first and second openings TH1 and TH2 may include a first region arranged on each of the upper surface of the first and second frames 111 and 112 and a second region arranged on each of the lower surface of the first and second frames 111 and 112. The width of the upper surface of the first region may be smaller than the width of the lower surface of the second region.

In addition, the first and second frames 111 and 112 may include a support member and first and second metal layers 111a and 112a surrounding the support member.

According to the embodiment, after the etching process of forming the first and second openings TH1 and TH2 is completed, the first and second metal layers 111a and 112a may be provided by a plating process and so on with respect to the support member constituting the first and second frame 111 and 112. Accordingly, the first and second metal layers 111a and 112a may be provided on surfaces of the support members constituting the first and second frames 111 and 112, respectively.

The first and second metal layers 111a and 112a may be provided on upper and lower surfaces of the first and second frames 111 and 112, respectively. In addition, the first and second metal layers 111a and 112a may be provided in a boundary region making contact with the first and second openings TH1 and TH2, respectively.

Meanwhile, the first and second metal layers 111a and 112a provided in the boundary region making contact with the first and second openings TH1 and TH2 may be combined with the first and second conductive layers 321 and 322 provided in the first and second openings TH1 and TH2, thereby forming first and second alloy layers 111*b* and 112*b*, respectively. The formation of the first and second alloy layers 111*b* and 112*b* will be described later.

For example, the first and second frames 111 and 112 may be provided with a Cu layer as a basic support member. In addition, the first and second metal layers 111*a* and 112*a* may include at least one of a Ni layer, an Ag layer, and the like.

In the case that the first and second metal layers 111*a* and 112*a* include a Ni layer, because the Ni layer has a small change with respect to thermal expansion, the position of the light emitting device disposed on the upper side may be stably fixed by the Ni layer even when the size or arranged position of the package body is changed due to the thermal expansion. In the case that the first and second metal layers 111*a* and 112*a* include an Ag layer, the Ag layer may efficiently reflect light emitted from the light emitting device disposed on the upper side thereof and improve light intensity.

According to the embodiment, when the first and second bonding parts 121 and 122 of the light emitting device 120 are arranged to have a small size to improve the light extraction efficiency, the width of the upper region of the first opening TH1 may be greater than or equal to the width of the first bonding part 121. In addition, the width of the upper region of the second opening TH2 may be greater than or equal to the width of the second bonding part 122.

In addition, the width of the upper region of the first opening part TH1 may be less than or equal to the width of a lower region of the first opening part TH1. In addition, the width of the upper region of the second opening part TH2 may be less than or equal to the width of a lower region of the second opening part TH2.

For example, the width of the upper region of the first opening TH1 may be in the range of tens of micrometers to hundreds of micrometers. In addition, the width of the lower region of the first opening TH1 may be tens of micrometers to hundreds of micrometers greater than the width of the upper region of the first opening TH1.

In addition, the width of the upper region of the second opening TH2 may be in the range of tens of micrometers to hundreds of micrometers. In addition, the width of the lower region of the second opening TH2 may be tens of micrometers to hundreds of micrometers greater than the width of the upper region of the second opening TH2.

A width W3 between the first opening part TH1 and the second opening part TH2 in a lower surface region of the first frame 111 and the second frame 112 may be several hundreds of micrometers. The width W3 between the first opening part TH1 and the second opening part TH2 in the lower surface region of the first frame 111 and the second frame 112 may be, for example, 100 micrometers to 150 micrometers.

When the light emitting device package 100 is mounted on a circuit board later, a sub-mount or the like, the width W3 between the first opening part TH1 and the second opening part TH2 in the lower surface region of the first frame 111 and the second frame 112 may be selected to be a predetermined distance or more so as to prevent an electrical short between pads.

As shown in FIGS. 3 and 5, according to an embodiment, the light emitting device package 100 may include a first resin 130.

The first resin 130 may be disposed between the body 113 and the light emitting device 120. The first resin 130 may be disposed between an upper surface of the body 113 and a lower surface of the light emitting device 120.

In addition, according to an embodiment, as shown in FIGS. 3 to 4, the light emitting device package 100 may include a recess R.

The recess R may be provided in the body 113. The recess R may be provided between the first opening part TH1 and the second opening part TH2. The recess R may be concavely provided from an upper surface toward a lower surface of the body 113. The recess R may be arranged under the light emitting device 120. The recess R may overlap with the light emitting device 120 in the first direction.

As shown in FIGS. 5 and 6, for example, the first resin 130 may be disposed in the recess R. The first resin 130 may be disposed between the light emitting device 120 and the body 113. The first resin 130 may be disposed between the first bonding part 121 and the second bonding part 122. For example, the first resin 130 may make contact with a side surface of the first bonding part 121 and a side surface of the second bonding part 122.

The first resin 130 may include an adhesive function. The first resin 130 may provide adhesive strength to neighboring components. The first resin 130 may provide stable fixing strength between the light emitting device 120 and the package body 110. The first resin 130 may make, for example, direct contact with the upper surface of the body 113. In addition, the first resin 130 may make direct contact with the lower surface of the light emitting device 120.

For example, the first resin 130 may include at least one of an epoxy-based material, a silicone-based material, a hybrid material including the epoxy-based material and the silicone-based material. In addition, for example, if the first resin 130 includes a reflection function, the adhesive may include white silicone.

The first resin 130 may provide the stable fixing strength between the body 113 and the light emitting device 120, and if light is emitted through the lower surface of the light emitting device 120, the first resin 130 may provide a light diffusion function between the light emitting device 120 and the body 113. When the light is emitted from the light emitting device 120 through the lower surface of the light emitting device 120, the first resin 130 may improve light extraction efficiency of the light emitting device package 100 by the light diffusion function. In addition, the first resin 130 may reflect the light emitted from the light emitting device 120. In the case of the first resin 130 including a reflection function, the first resin 130 may be formed of a material including $TiO_2$, $SiO_2$ or the like.

According to an embodiment, a depth T1 of the recess R may be smaller than a depth T2 of the first opening part TH1 or a depth T2 of the second opening part TH2.

The depth T1 of the recess R may be determined in consideration of adhesive strength of the first resin 130. The depth T1 of the recess R may be determined in consideration of stable strength of the body 113 and/or determined to prevent a crack from being generated on the light emitting device package 100 due to heat emitted from the light emitting device 120.

The recess R may provide a space suitable for performing a sort of an under fill process at a lower portion of the light emitting device 120. The under fill process may be a process of disposing the first resin 130 at the lower portion of the light emitting device 120 after mounting the light emitting device 120 on the package body 110, or a process of disposing the light emitting device 120 after disposing the first resin 130 in the recess R to mount the light emitting device 120 on the package body 110 through the first resin 130 during a process of mounting the light emitting device 120 on the package body 110. The recess R may have a first depth or more to sufficiently provide the first resin 130 between the lower surface of the light emitting device 120 and the upper surface of the body 113. In addition, the recess R may have a second depth or less to provide the stable strength to the body 113.

The depth T1 and a width W4 of the recess R may influence a position and fixing strength of the first resin 130. The depth T1 and the width W4 of the recess R may be determined such that sufficient fixing strength is provided by the first resin 130 disposed between the body 113 and the light emitting device 120.

For example, the depth T1 of the recess R may be several tens of micrometers. The depth T1 of the recess R may be 40 micrometers to 60 micrometers.

In addition, the width W4 of the recess R may be several tens of micrometers to several hundreds of micrometers. In this case, the width W4 of the recess R may be defined in a long axis direction of the light emitting device 120.

The width W4 of the recess R may be narrower than a distance between the first bonding part 121 and the second bonding part 122. The width W4 of the recess R may be 140 micrometers to 160 micrometers. For example, the width W4 of the recess R may be 150 micrometers.

The depth T2 of the first opening part TH1 may be determined corresponding to a thickness of the first frame 111. The depth T2 of the first opening part TH1 may be determined such that the first frame 111 may maintain stable strength.

The depth T2 of the second opening part TH2 may be determined corresponding to a thickness of the second frame 112. The depth T2 of the second opening part TH2 may be determined such that the second frame 112 may maintain stable strength.

The depth T2 of the first opening part TH1 and the depth T2 of the second opening part TH2 may be determined corresponding to a thickness of the body 113. The depth T2 of the first opening part TH1 and the depth T2 of the second opening part TH2 may be determined such that the body 113 may maintain the stable strength.

For example, the depth T2 of the first opening part TH1 may be hundreds of micrometers. The depth T2 of the first opening part TH1 may be provided in the range of 180 micrometers to 220 micrometers. For example, the depth T2 of the first opening part TH1 may be 200 micrometers.

For example, the T2-T1 thickness may be selected to be at least 100 micrometers. This is based on the thickness of the injection process that may provide crack free in the body 113.

According to the embodiment, the ratio of T2/T1 may be provided in the range of 2 to 10. For example, when the thickness of T2 is provided as 200 micrometers, the thickness of T1 may be provided in the range of 20 micrometers to 100 micrometers.

<Transparent Resin Layer, Reflective Resin Layer, Phosphor Layer>

In addition, as shown in FIGS. 3, 6 and 8, the light emitting device package 100 according to an embodiment may include a transparent resin layer 160 and a reflective resin layer 170.

As described above, in the related art, since, when the phosphor layer is adjacent to the light emitting element, the light conversion performance of the phosphor layer is deteriorated due to deterioration of the phosphor layer, a technique of disposing the phosphor layer while the phosphor layer is spaced apart from the light emitting device (so-called remote phosphor technology) has been studied.

In addition, in the related art, while a technique of arranging a reflective layer in a cavity of a light emitting device package for improving brightness has been studied, there has been a research result that luminance is greatly improved when the reflective layer technology and the remote phosphor technology are combined organically.

However, according to the related art, because there is a technical difficulty in uniformly arranging the reflective layer in the light emitting device package around the light emitting device, there is a limit in improving the luminance.

Thus, a technical object of the embodiment is to provide a light emitting device package, a method of manufacturing a light emitting device package, and a light source unit capable of greatly improving luminance by uniformly disposing the reflection layer around a light emitting device in a light emitting device package.

According to an embodiment, as shown in FIG. 6, the transparent resin layer 160 may include a first transparent resin layer 162 disposed between the light emitting device 120 and a phosphor layer 180 formed thereafter, so that the phosphor layer 180 and the light emitting device 120 are spaced apart from each other, thereby preventing the phosphor layer from being deteriorated.

According to an embodiment, the transparent resin layer 160 may include a second transparent resin layer 161 disposed between the reflective resin layer 170 and the light emitting device 120. The second transparent resin layer 161 may be uniformly disposed on a side surface of the light emitting device 120.

The transparent resin layer 160 may be a transparent material and may include light diffusion particles. For example, the transparent resin layer 160 may include at least one of an epoxy-based material, a silicone-based material and a hybrid material including an epoxy-based material and a silicon-based material. For example, the transparent resin layer 160 may include a clear type silicone or a light diffusion particle such as silicone containing $ZrO_2$, ZnO, $Al_2O_3$, and the like.

Meanwhile, according to the related art, when a reflection layer is disposed in the light emitting device package, if the surface of the light emitting device has hydrophilicity, the reflection layer may be widely diffused to the surface of the light emitting device.

Thus, due to the reflection layer widely disposed on the surface of the light emitting device, the efficiency of extracting the light emitted from the light emitting device by the light emitting device package may be deteriorated.

According to the embodiment, in order to prevent the reflective resin layer 170 from diffusing widely on the surface of the light emitting device 120, the transparent resin layer 160 is disposed and then cured, so that the light extraction efficiency of the light emitting device package may be improved.

FIG. 7A is a sectional view illustrating a process of forming transparent resin on a light emitting device according to an embodiment.

According to an embodiment, the light emitting device 120 is disposed on a support substrate 190. Then, the transparent resin layer 160 is formed on the light emitting device 120. The transparent resin layer 160 may be formed through a molding or dotting process. The transparent resin layer 160 may include at least one of an epoxy-based material, a silicone-based material and a hybrid material including an epoxy-based material and a silicon-based material. For example, the transparent resin layer 160 may include a clear type silicone or a light diffusion particle such as silicone containing $ZrO_2$, $ZnO$, $Al_2O_3$, and the like.

FIG. 7B is a photograph showing a transparent resin layer 160 formed on a light emitting device 120.

Therefore, unlike the structure using sedimentation according to the related art, according to the embodiment, the transparent resin layer 160 may be uniformly formed on the side surface of the light emitting device. Thus, as shown in FIG. 6, when the light emitting device is rotated at 180 degrees and mounted in the form of a flip chip, the width of the upper portion of the transparent resin layer 160 may be greater than the width of the lower portion thereof. In addition, in the side surface shape, the inclined surface is formed flat without any roughness, thereby improving the light reflection efficiency, so that there is a special effect of forming an optical cavity to be described below.

Next, as shown in FIG. 8, the embodiment may include the reflective resin layer 170.

The reflective resin layer 170 may include the light emitting device 120 and the first reflective resin layer 170 disposed on the side surface of the cavity C. In addition, the embodiment may include the second reflective resin (not shown) disposed the first and second bonding parts of the light emitting device 120 and the body 113, but is not limited thereto.

The reflective resin layer 170 may include white silicon. For example, the reflective resin layer 170 may be mad of silicon including $TiO_2$, $ZnO$, $Al_2O_3$, $BN$, and the like, but the embodiment is not limited thereto.

The reflective resin layer 170 may be formed at an upper side of the cavity C through a gap-fill process. Alternatively, the reflective resin layer 170 may be formed at a lower side through the first or second opening TH1 or TH2 formed in the frame through the gap-fill process. Alternatively, the reflective resin layer 170 may be formed by simultaneously performing the gap-fill process at the upper and lower sides.

According to the related art, it has been difficult to form a light-reflecting resin into a cone shape whose sides are cut except for the upper surface of a light emitting device. Thus, it has been difficult to provide a light cavity.

However, according to the embodiment, the reflective resin layer 170 may be disposed near the light emitting device in a cone shape whose ends are cut, so that diffusing reflection is realized, thereby realizing a light cavity and greatly improving the brightness.

In addition, according to the related art, it has been difficult to realize a technique of allowing the reflective resin to be spaced apart from the light emitting device by a predetermined distance.

However, according to the embodiment, the transparent resin layer 160 is disposed on the side surface of the light emitting device to have a uniform side surface, so that the reflective resin layer 170 may be uniformly spaced apart from the light emitting device 120, thereby greatly improving the light reflectance.

Next, FIG. 9 is a diagram illustrating a process of forming a phosphor layer 180 according to an embodiment. The phosphor layer 180 may include a wavelength conversion unit for receiving light emitted from the light emitting device 120 to provide wavelength-converted light. For example, the phosphor layer 180 may include at least one selected from the group consisting of a phosphor, a quantum dot, and the like.

According to the embodiment, the reflective resin layer 170 is disposed in the cone shape whose the ends are cut near the light emitting device, and is organically coupled with the remote phosphor layer 180 to form the light cavity, so that the diffusing reflection may be very effectively implemented, thereby remarkably enhancing the light brightness.

<First, Second Conductive Layers, and First, Second Alloy Layers>

In addition, according to an embodiment, as shown in FIGS. 3 and 10, the light emitting device package 100 may include a first conductive layer 321 and a second conductive layer 322. The first conductive layer 321 may be spaced apart from the second conductive layer 322.

The first conductive layer 321 may be provided in the first opening part TH1. The first conductive layer 321 may be disposed under the first bonding part 121. A width of the first conductive layer 321 may be smaller than a width of the first bonding part 121.

The first bonding part 121 may have a width defined in a second direction perpendicular to the first direction along which the first opening part TH1 is provided. The width of the first bonding part 121 may be larger than the width of the first opening part TH1 in the second direction.

The first conductive layer 321 may make direct contact with a lower surface of the first bonding part 121. The first conductive layer 321 may be electrically connected to the first bonding part 121. The first conductive layer 321 may be surrounded by the first frame 111. The first conductive layer 321 may include a lower surface concavely provided in a direction from a lower portion to an upper portion thereof.

The second conductive layer 322 may be provided in the second opening part TH2. The second conductive layer 322 may be disposed under the second bonding part 122. A width of the second conductive layer 322 may be smaller than a width of the second bonding part 122.

The second bonding part 122 may have a width defined in the second direction perpendicular to the first direction along which the second opening part TH2 is provided. The width of the second bonding part 122 may be larger than the width of the second opening part TH2 in the second direction.

The second conductive layer 322 may make direct contact with a lower surface of the second bonding part 122. The second conductive layer 322 may be electrically connected to the second bonding part 122. The second conductive layer 322 may be surrounded by the second frame 112. The second conductive layer 322 may include a lower surface concavely provided in a direction from a lower portion to an upper portion thereof.

The first conductive layer 321 and the second conductive layer 322 may include one material selected from the group consisting of Ag, Au, Pt, Sn, Cu and the like, or an alloy thereof. However, embodiments are not limited thereto, and the first conductive layer 321 and the second conductive layer 322 may be formed of a material capable of ensuring a conduction function.

For example, the first conductive layer 321 and the second conductive layer 322 may be formed of a conductive paste. The conductive paste may include a solder paste, a silver paste or the like, and may be composed of a multilayer formed of mutually different materials, or a multilayer or a single layer formed of an alloy. For example, the first conductive layer 321 and the second conductive layer 322 may include SAC(Sn—Ag—Cu).

According to the embodiment, in the process of forming the first and second conductive layers 321 and 322 or in the heat treatment process after providing the first and second conductive layers 321 and 322, an intermetallic compound (IMC) layer may be provided between the first and second conductive layers 321 and 322 and the first and second frames 111 and 112.

For example, first and second alloy layers 111b and 112b may be formed by the combination between materials of the first and second conductive layers 321 and 322 and the first and second metal layers 111a and 112a of the first and second frames 111 and 112, respectively.

Accordingly, the first conductive layer 321 and the first frame 111 may be stably coupled to each other physically and electrically. The first conductive layer 321, the first alloy layer 111b, and the first frame 111 may be stably coupled to each other physically and electrically.

In addition, the second conductive layer 322 and the second frame 112 may be stably coupled to each other physically and electrically. The second conductive layer 322, the second alloy layer 112b, and the second frame 112 may be stably coupled to each other physically and electrically.

For example, the first and second alloy layers 111b and 112b may include at least one intermetallic compound layer selected from the group including AgSn, CuSn, AuSn, and the like. The intermetallic compound layer may be formed by the combination of a first material and a second material, and the first material may be provided from the first and second conductive layers 321 and 322, and the second material may be provided from the first and second metal layer 111a and 112a or the support members of the first and second frames 111 and 112.

When the first and second conductive layers 321 and 322 include an Sn material and the first and second metal layers 111a and 112a include an Ag material, an intermetallic compound layer of AgSn may be formed by the combination of the Sn material and the Ag material in the process of providing the first and second conductive layers 321 and 322, or in the heat treatment process thereafter.

In addition, when the first and second conductive layers 321 and 322 include the Sn material and the first and second metal layers 111a and 112a include an Au material, an intermetallic compound layer of AuSn may be formed by the combination of the Sn material and the Au material in the process of providing the first and second conductive layers 321 and 322, or in the heat treatment process thereafter.

In addition, when the first and second conductive layers 321 and 322 include the Sn material and the support member of the first and second frames 111 and 112 include a Cu material, an intermetallic compound layer of CuSn may be formed by the combination of the Sn material and the Cu material in the process of providing the first and second conductive layers 321 and 322, or in the heat treatment process thereafter.

In addition, when the first and second conductive layers 321 and 322 include the Ag material and the support member of the first and second frames 111 and 112 include the Sn material, an intermetallic compound layer of AgSn may be formed by the combination of the Ag material and the Sn material in the process of providing the first and second conductive layers 321 and 322, or in the heat treatment process thereafter.

The aforementioned intermetallic compound layer may have a higher melting point than a general bonding material. In addition, the heat treatment process of forming the intermetallic compound layer may be performed at a temperature lower than the melting point of the general bonding material.

Therefore, according to an embodiment, even if the light emitting device package 100 is bonded to a main substrate and the like through the reflow process, the re-melting phenomenon may not occur, so that the electrical connection and physical bonding strength may not be deteriorated.

In addition, in a light emitting device package 100 and the method of manufacturing a light emitting device package according to an embodiment, the package body 110 does not need to be exposed at high temperatures in a process of manufacturing the light emitting device package. Therefore, according to an embodiment, it is possible to prevent the package body 110 from being exposed at high temperatures so as to be damaged or discolored.

Accordingly, materials constituting the body 113 can be variously selected. According to an embodiment, the body 113 may be formed of expensive materials such as ceramic, and relatively inexpensive resin materials.

For example, the body 113 may include at least one material selected from the group consisting of a PolyPhtalAmide (PPA) resin, a PolyCyclohexylenedimethylene Terephthalate (PCT) resin, an epoxy molding compound (EMC) resin, and a silicone molding compound (SMC) resin.

Meanwhile, according to the embodiment, the intermetallic compound layer may also be provided between the first and second bonding parts 121 and 122 and the first and second conductive layers 321 and 322.

As similar to the above description, according to the embodiment, in the process of forming the first and second conductive layers 321 and 322 or in the heat treatment process after providing the first and second conductive layers 321 and 322, the intermetallic compound (IMC) layer may be provided between the first and second conductive layers 321 and 322 and the first and second bonding parts 121 and 122.

For example, an alloy layer may be formed by the combination between materials constituting the first and second conductive layers 321 and 322 and the first and second bonding parts 121 and 122.

Accordingly, the first conductive layer 321 and the first bonding part 121 may be stably coupled to each other physically and electrically. The first conductive layer 321, the alloy layer, and the first bonding part 121 may be stably coupled to each other physically and electrically.

In addition, the second conductive layer 322 and the second bonding part 122 may be stably coupled to each other physically and electrically. The second conductive layer 322, the alloy layer, and the second bonding part 122 may be stably coupled to each other physically and electrically.

For example, the alloy layer may include at least one intermetallic compound layer selected from the group including AgSn, CuSn, AuSn, and the like. The intermetallic compound layer may be formed by the combination of a first material and a second material, and the first material may be provided from the first and second conductive layers 321 and 322, and the second material may be provided from the first and second bonding parts 121 and 122.

When the first and second conductive layers 321 and 322 include an Sn material and the first and second bonding parts 121 and 122 include an Ag material, an intermetallic compound layer of AgSn may be formed by the combination of the Sn material and the Ag material in the process of providing the first and second conductive layers 321 and 322, or in the heat treatment process thereafter.

In addition, when the first and second conductive layers 321 and 322 include an Sn material and the first and second bonding parts 121 and 122 include an Au material, an intermetallic compound layer of AuSn may be formed by the combination of the Sn material and the Au material in the process of providing the first and second conductive layers 321 and 322, or in the heat treatment process thereafter.

In addition, when the first and second conductive layers 321 and 322 include an Ag material and the first and second bonding parts 121 and 122 include an Sn material, an intermetallic compound layer of AgSn may be formed by the combination of the Ag material and the Sn material in the process of providing the first and second conductive layers 321 and 322, or in the heat treatment process thereafter.

The aforementioned intermetallic compound layer may have a higher melting point than a general bonding material. In addition, the heat treatment process of forming the intermetallic compound layer may be performed at a temperature lower than the melting point of the general bonding material.

Therefore, according to an embodiment, even if the light emitting device package 100 is bonded to a main substrate and the like through the reflow process, the re-melting phenomenon may not occur, so that the electrical connection and physical bonding strength may not be deteriorated.

In addition, according to an embodiment, as shown in FIGS. 3 to 10, the light emitting device package 100 may include a first lower recess R11 and a second lower recess R12. The first lower recess R11 and the second lower recess R12 may be spaced apart from each other.

The first lower recess R11 may be provided in a lower surface of the first frame 111. The first lower recess R11 may be concavely provided from the lower surface toward an upper surface of the first frame 111. The first lower recess R11 may be spaced apart from the first opening part TH1.

The first lower recess R11 may have a width of several micrometers to several tens of micrometers. A resin part may be provided in the first lower recess R11. The resin part filled in the first lower recess R11 may be, for example, formed of a material same to a material of the body 113.

However, embodiments are not limited thereto, and the resin part may be formed of a material selected from materials representing low adhesive strength and low wettability with the first and second conductive layers 321 and 322. Alternatively, the resin part may be selected from materials representing low surface tension with the first and second conductive layers 321 and 322.

For example, the resin part filled in the first lower recess R11 may be provided in a process of forming the first frame 111, the second frame 112, and the body 113 through an injection molding process or the like.

The resin part filled in the first lower recess R11 may be disposed at a periphery of the lower surface region of the first frame 111 provided with the first opening part TH1. The lower surface region of the first frame 111 provided with the first opening part TH1 may have a shape in the form of an island and may be separated from the lower surface of the first frame 111 around the lower surface region.

For example, as shown in FIG. 2, the lower surface region of the first frame 111 provided with the first opening part TH1 may be isolated from the first frame 111 around the lower surface region by the resin part filled in the first lower recess R11 and the body 113.

Therefore, if the resin part is formed of a material representing low adhesive strength and low wettability with the first and second conductive layers 321 and 322, or a material representing low surface tension between the resin part and the first and second conductive layers 321 and 322, the first conductive layer 321 provided in the first opening part TH1 can be prevented from being diffused over the resin part filled in the first lower recess R11 or the body 113 by overflowing from the first opening part TH1.

This is based on adhesion relation between the first conductive layer 321 and the resin part and between the first conductive layer 321 and the body 113, or the low wettability and low surface tension between the resin part and the first and second conductive layers 321 and 322. In other words, a material constituting the first conductive layer 321 may be selected to represent good adhesion with the first frame 111. In addition, the material constituting the first conductive layer 321 may be selected to represent low adhesion with the resin part and the body 113.

Accordingly, the first conductive layer 321 is prevented from flowing out or spreading to an outside of the region where the resin part or the body 113 is provided by flowing out from the first opening part TH1 toward a region where the resin part or the body 113 is provided, and the first conductive layer 321 can be stably disposed in a region where the first opening part TH1 is provided.

Therefore, if the first conductive layer 321 disposed in the first opening part TH1 flows out, the first conductive layer 321 can be prevented from expanding to an external region of the resin part or the first lower recess R11 provided with the body 113. In addition, the first conductive layer 321 can be stably connected to the lower surface of the first bonding part 121 in the first opening part TH1.

Therefore, when the light emitting device package is mounted on the circuit board, the first conductive layer 321 and the second conductive layer 322 can be prevented from being short-circuited by making contact with each other, and it can be remarkably easy to control an amount of the first and second conductive layers 321 and 322 in a process of disposing the first and second conductive layers 321 and 322.

In addition, the second lower recess R12 may be provided in a lower surface of the second frame 112. The second lower recess R12 may be concavely provided from the lower surface toward an upper surface of the second frame 112. The second lower recess R12 may be spaced apart from the second opening part TH2.

The second lower recess R12 may have a width of several micrometers to several tens of micrometers. The resin part may be provided in the second lower recess R12. The resin part filled in the second lower recess R12 may be, for example, formed of a material same to a material of the body 113.

However, embodiments are not limited thereto, and the resin part may be formed of a material selected from materials representing low adhesive strength and low wettability with the first and second conductive layers 321 and 322. Alternatively, the resin part may be selected from materials representing low surface tension with the first and second conductive layers 321 and 322.

For example, the resin part filled in the second lower recess R12 may be provided in the process of forming the first frame 111, the second frame 112, and the body 113 through an injection molding process or the like.

The resin part filled in the second lower recess R12 may be disposed at a periphery of the lower surface region of the second frame 112 provided with the second opening part TH2. The lower surface region of the second frame 112 provided with the second opening part TH2 may have a shape in the form of an island and may be separated from the lower surface of the second frame 112 around the lower surface region.

For example, as shown in FIG. 2, the lower surface region of the second frame 112 provided with the second opening part TH2 may be isolated from the second frame 112 around the lower surface region by the resin part filled in the second lower recess R12 and the body 113.

Therefore, if the resin part is formed of a material representing low adhesive strength and low wettability with the first and second conductive layers 321 and 322, or a material representing low surface tension between the resin part and the first and second conductive layers 321 and 322, the second conductive layer 322 provided in the second opening part TH2 can be prevented from being diffused over the resin part filled in the second lower recess R12 or the body 113 by overflowing from the second opening part TH2.

This is based on adhesion relation between the second conductive layer 322 and the resin part and between the second conductive layer 322 and the body 113, or the low wettability and low surface tension between the resin part and the first and second conductive layers 321 and 322. In other words, a material constituting the second conductive layer 322 may be selected to represent good adhesion with the second frame 112. In addition, the material constituting the second conductive layer 322 may be selected to represent low adhesion with the resin part and the body 113.

Accordingly, the second conductive layer 322 is prevented from flowing out or spreading to an outside of the region where the resin part or the body 113 is provided by flowing out from the second opening part TH2 toward a region where the resin part or the body 113 is provided, and the second conductive layer 322 can be stably disposed in a region where the second opening part TH2 is provided.

Therefore, if the second conductive layer 322 disposed in the second opening part TH2 flows out, the second conductive layer 322 can be prevented from expanding to an external region of the resin part or the second lower recess R12 provided with the body 113. In addition, the second conductive layer 322 can be stably connected to the lower surface of the second bonding part 122 in the second opening part TH2.

Therefore, when the light emitting device package is mounted on the circuit board, the first conductive layer 321 and the second conductive layer 322 can be prevented from being short-circuited by making contact with each other, and it can be remarkably easy to control an amount of the first and second conductive layers 321 and 322 in the process of disposing the first and second conductive layers 321 and 322.

Meanwhile, according to the light emitting device package 100 of the embodiment, as shown in FIG. 3, the first resin 130 provided in the recess R may be provided between the lower surface of the light emitting device 120 and the upper surface of the package body 110. When viewed from the top of the light emitting device 120, the first resin 130 may be provided around the first and second bonding parts 121 and 122. In addition, when viewed from the top of the light emitting device 120, the first resin 130 may be provided around the first and second openings TH1 and TH2.

The first resin 130 may function to stably fix the light emitting device 120 to the package body 110. In addition, the first resin 130 may be disposed around the first and second bonding parts 121 and 122 while making contact with side surfaces of the first and second bonding parts 121 and 122.

The first resin 130 may seal peripheries of the first bonding part 121 and the second bonding part 122. The resin 130 may prevent the first conductive layer 321 and the second conductive layer 322 from being diffused and moved by overflowing from regions of the first opening TH1 and the second opening TH2 outward of the light emitting device 120. When the first and second conductive layers 321 and 322 are diffused and moved outward of the light emitting device 120, a failure due to a short may be caused since the first and second conductive layers 321 and 322 may make contact with the active layer of the light emitting device 120. Accordingly, when the first resin 130 is disposed, the short caused by the first and second conductive layers 321 and 322 and the active layer may be prevented, thereby improving the reliability of the light emitting device package according to the embodiment.

In addition, the resin 130 may prevent the first conductive layer 321 and the second conductive layer 322 from being diffused and moved by overflowing from regions of the first opening TH1 and the second opening TH2 under the lower surface of the light emitting device 120 in the direction of the recess. Accordingly, the first conductive layer 321 and the second conductive layer 322 may be prevented from being electrically short-circuited under the light emitting device 120.

In addition, according to the embodiment, the light emitting structure 123 may be provided as a compound semiconductor. The light emitting structure 123 may be provided as, for example, a group II-VI or group compound semiconductor. For example, the light emitting structure 123 may include at least two elements selected from aluminum (Al), gallium (Ga), indium (In), phosphorus (P), arsenic (As), and nitrogen (N).

The light emitting structure 123 may include the first conductive semiconductor layer, the active layer, and the second conductive semiconductor layer.

In the light emitting device package 100 according to an embodiment, a power source may be connected to the first bonding part 121 through a region of the first opening part TH1, and the power source may be connected to the second bonding part 122 through a region of the second opening part TH2.

Accordingly, the light emitting device 120 can be driven by a driving power supplied through the first bonding part 121 and the second bonding part 122. In addition, the light emitted from the light emitting device 120 may be directed in an upward direction of the package body 110.

Meanwhile, the light emitting device package 100 according to the embodiment described above may be mounted and provided on a sub-mount, a circuit board or the like.

However, when a light emitting device package is conventionally mounted on a sub-mount, a circuit board or the like, a high temperature process such as a reflow process can be applied. At this time, in the reflow process, a re-melting phenomenon may occur in a bonding region between a lead frame and the light emitting device provided in the light emitting device package, thereby weakening stability of electrical connection and physical coupling.

However, in the light emitting device package and the method of manufacturing a light emitting device package according to an embodiment, a bonding part of the light emitting device may receive a driving power through a conductive layer disposed in an opening part. In addition, a melting point of the conductive layer disposed in the opening part may be selected to be a value higher than a melting point of a typical bonding material and a melting point of an IMC layer.

Therefore, according to an embodiment, even if the light emitting device package 100 is bonded to a main substrate and the like through the reflow process, the re-melting phenomenon may not occur, so that the electrical connection and physical bonding strength may not be deteriorated.

In addition, in a light emitting device package 100 and the method of manufacturing a light emitting device package according to an embodiment, the package body 110 does not need to be exposed at high temperatures in a process of manufacturing the light emitting device package. Therefore, according to an embodiment, it is possible to prevent the package body 110 from being exposed at high temperatures so as to be damaged or discolored.

Accordingly, materials constituting the body 113 can be variously selected. According to an embodiment, the body 113 may be formed of expensive materials such as ceramic, and relatively inexpensive resin materials.

For example, the body 113 may include at least one material selected from the group consisting of a PolyPhtalAmide (PPA) resin, a PolyCyclohexylenedimethylene Terephthalate (PCT) resin, an epoxy molding compound (EMC) resin, and a silicone molding compound (SMC) resin.

Next, as shown in FIGS. 3 and 11, the light emitting device package according to the embodiment may include a second resin layer 115 disposed in the first and second openings TH1 and TH2. The second resin layer 115 may be disposed under the first and second conductive layers 321 and 322.

The second resin layer 115 may protect the first and second conductive layers 321 and 322. The second resin layer 115 may seal the first and second openings TH1 and TH2. The second resin layer 115 may prevent the first and second conductive layers 321 and 322 from being diffused and moved to lower portions of the first and second openings TH1 and TH2.

For example, the second resin layer 115 may include a material similar to the body 113. The second resin layer 115 may include at least one material selected from the group including polyphthalamide (PPA) resin, polycyclohexylenedimethylene terephthalate (PCT) resin, epoxy molding compound (EMC) resin and silicone molding compound (SMC) resin.

In addition, the second resin layer 115 may include at least one of an epoxy-based material, a silicone-based material, and a hybrid material including the epoxy-based material and the silicon-based material.

Next, the light emitting device package according to an embodiment of the present invention shown in FIG. 12 is an example in which the light emitting device package described with reference to FIGS. 1 to 11 is mounted on a circuit board 410 and provided.

According to an embodiment, as shown in FIG. 12, the light emitting device package may include a circuit board 410, the package body 110, and the light emitting device 120.

The circuit board 410 may include a first pad 411, a second pad 412, and a substrate 413. The substrate 413 may be provided with a power supply circuit for controlling the driving of the light emitting device 120.

The package body 110 may be disposed on the circuit board 410. The first pad 411 and the first bonding part 121 may be electrically connected to each other. The second pad 412 and the second bonding part 122 may be electrically connected to each other.

The first pad 411 and the second pad 412 may include a conductive material. For example, the first pad 411 and the second pad 412 may include at least one material selected from the group consisting of Ti, Cu, Ni, Au, Cr, Ta, Pt, Sn, Ag, P, Fe, Sn, Zn and Al, or an alloy thereof. The first pad 411 and the second pad 412 may be composed of a single layer or a multilayer.

The package body 110 may include a first frame 111 and a second frame 112. The first frame 111 and the second frame 112 may be spaced apart from each other.

The package body 110 may include a body 113. The body 113 may be disposed between the first frame 111 and the second frame 112. The body 113 may function as a sort of an electrode separation line.

The first frame 111 and the second frame 112 may be conductive frames. The first frame 111 and the second frame 112 may provide stable the structural strength to the package body 110, and may be electrically connected to the light emitting device 120.

Meanwhile, FIG. 13 is a view illustrating another example of the light emitting device package according to the embodiment of the present invention.

The light emitting device package according to the embodiment shown in FIG. 13 may further include a heat dissipating member 150 as compared with the light emitting device package according to the embodiment shown in FIG. 3.

The heat dissipating member 150 may be disposed on a third opening TH3 provided in the body 113 and may be disposed under the recess R. The heat dissipating member 130 may be disposed between the first frame 111 and the second frame 112.

For example, the heat dissipating member 150 may include at least one of an epoxy-based material, a silicone-based material, and a hybrid material including the epoxy-based material and the silicon-based material. In addition, for example, when the dissipating member 130 includes a reflection function, the dissipating member 150 may include white silicone. In addition, the heat dissipating member 130 may include a material selected from the group including $Al_2O_3$, AlN, and the like having good thermal conductivity.

According to the embodiment, when the heat dissipating member 150 includes a material having good thermal conductivity, heat generated from the light emitting device 120 may be effectively dissipated. Accordingly, because the heat dissipation of the light emitting device 120 is effectively performed, the light extraction efficiency of the light emitting device 120 can be improved.

In addition, when the heat dissipating member 150 includes a reflective material, a light diffusion function may be provided between the light emitting device 120 and the body 113 with respect to light emitted to the lower surface of the light emitting device 120. When the light is emitted from the light emitting device 120 to the lower surface of the light emitting device 120, the heat dissipating member 130 provides the light diffusion function, so that the light extraction efficiency of the light emitting device package can be improved.

According to the embodiment, the heat dissipating member 150 may reflect the light emitted from the light emitting device 120. When the heat dissipating member 150 includes the reflection function, the heat dissipating member 130 may be formed of a material including $TiO_2$, $SiO_2$, and the like.

FIG. 14 is a plan view illustrating a light emitting device according to an embodiment of the present invention, and FIG. 15 is a sectional view taken along the line A-A of a light emitting device shown in FIG. 14.

For better understanding, though disposed under the first bonding part 2171 and the second bonding part 2172, FIG. 14 shows a first sub-electrode 2141 electrically connected to the first bonding part 2171, and a second sub-electrode 2142 electrically connected to the second bonding part 2172.

As shown in FIGS. 14 and 15, the light emitting device 2100 according to the embodiment may include a light emitting structure 2110 disposed on a substrate 2105.

The substrate 2105 may be selected from the group including a sapphire substrate ($Al_2O_3$), SiC, GaAs, GaN, ZnO, Si, GaP, InP and Ge. For example, the substrate 2105 may be provided as a patterned sapphire substrate (PSS) formed on an upper surface thereof with a concavo-convex pattern.

The light emitting structure 2110 may include a first conductive semiconductor layer 2111, an active layer 2112, and a second conductive semiconductor layer 2113. The active layer 2112 may be disposed between the first conductive semiconductor layer 2111 and the second conductive semiconductor layer 2113. For example, the active layer 2112 may be disposed on the first conductive semiconductor layer 2111, and the second conductive semiconductor layer 2113 may be disposed on the active layer 2112.

According to the embodiment, the first conductive semiconductor layer 2111 may be provided as an n-type semiconductor layer, and the second conductive semiconductor layer 2113 may be provided as a p-type semiconductor layer. According to another embodiment, the first conductive semiconductor layer 2111 may be provided as a p-type semiconductor layer, and the second conductive semiconductor layer 2113 may be provided as an n-type semiconductor layer.

Hereinafter, for the descriptive convenience, it will be described with reference to the case that the first conductive semiconductor layer 2111 is provided as an n-type semiconductor layer and the second conductive semiconductor layer 2113 is provided as a p-type semiconductor layer.

As shown in FIG. 15, the light emitting device 2100 according to the embodiment may include a transparent electrode layer 2130. The transparent electrode layer 2130 may increase light output by improving a current diffusion.

For example, the transparent electrode layer 2130 may include at least one selected from the group including a metal, metal oxide, and metal nitride. The transparent electrode layer 2130 may include a light transmissive material.

The transparent electrode layer 2130 may include selected from the group including indium tin oxide (ITO), indium zinc oxide (IZO), IZO nitride (IZON), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, Ni/IrOx/Au/ITO, Pt, Ni, Au, Rh, and Pd.

As shown in FIGS. 14 and 15, the light emitting device 2100 according to the embodiment may include a reflective layer 2160. The reflective layer 2160 may include a first reflective layer 2161, a second reflective layer 2162, and a third reflective layer 2163. The reflective layer 2160 may be disposed on the transparent electrode layer 2130.

The second reflective layer 2162 may include a first opening h1 for exposing the transparent electrode layer 2130. The second reflective layer 2162 may include a plurality of first openings h1 disposed on the transparent electrode layer 2130.

The first reflective layer 2161 may include second openings h2 for exposing an upper surface of the first conductive semiconductor layer 2111.

The third reflective layer 2163 may be disposed between the first reflective layer 2161 and the second reflective layer 2162. For example, the third reflective layer 2163 may be connected to the first reflective layer 2161. In addition, the third reflective layer 2163 may be connected to the second reflective layer 2162. The third reflective layer 2163 may be disposed while physically making direct contact with the first reflective layer 2161 and the second reflective layer 2162.

The reflective layer 2160 according to the embodiment may make contact with the second conductive semiconductor layer 2113 through contact holes provided in the transparent electrode layer 2130. The reflective layer 2160 may physically make contact with an upper surface of the second conductive semiconductor layer 2113 through the contact holes provided in the transparent electrode layer 2130.

The reflective layer 2160 may be provided as an insulating reflective layer. For example, the reflective layer 2160 may be provided as a distributed bragg reflector (DBR) layer. In addition, the reflective layer 2160 may be provided as an omni directional reflector (ODR) layer. In addition, the reflective layer 2160 may be provided by stacking the DBR layer and the ODR layer.

As shown in FIGS. 14 and 15, the light emitting device 2100 according to the embodiment may include the first sub-electrode 2141 and the second sub-electrode 2142.

The first sub-electrode 2141 may be electrically connected to the first conductive semiconductor layer 2111 in the second opening h2. The first sub-electrode 2141 may be disposed on the first conductive semiconductor layer 2111. For example, according to the light emitting device 2100 of the embodiment, the first sub-electrode 2141 may be disposed on the upper surface of the first conductive semiconductor layer 2111 in the recess provided to a partial region of the first conductive semiconductor layer 2111 through the second conductive semiconductor layer 2113 and the active layer 2112.

The first sub-electrode 2141 may be electrically connected to the upper surface of the first conductive semiconductor layer 2111 through the second opening h2 provided in the first reflective layer 2161. The second opening h2 and the recess may vertically overlap each other. For example, as shown in FIGS. 24 and 25, the first sub-electrode 2141 may make direct contact with the upper surface of the first conductive semiconductor layer 2111 in recess regions.

The second sub-electrode 2142 may be electrically connected to the second conductive semiconductor layer 2113. The second sub-electrode 2142 may be disposed on the second conductive semiconductor layer 2113. According to the embodiment, the transparent electrode layer 2130 may be disposed between the second sub-electrode 2142 and the second conductive semiconductor layer 2113.

The second sub-electrode 2142 may be electrically connected to the second conductive semiconductor layer 2113 through the first opening h1 provided in the second reflective layer 2162. For example, as shown in FIGS. 14 and 15, the second sub-electrode 2142 may be electrically connected to the second conductive semiconductor layer 2113 through the transparent electrode layer 2130 in P regions.

As shown in FIGS. 14 and 15, the second sub-electrode 2142 may make direct contact with an upper surface of the transparent electrode layer 2130 through a plurality of first openings h1 provided in the second reflective layer 2162 in the P regions.

According to the embodiment, as shown in FIGS. 14 and 15, the first sub-electrode 2141 and the second sub-electrode 2142 may have polarities to each other and may be spaced apart from each other.

For example, the first sub-electrode 2141 may be provided in line shapes. In addition, for example, the second sub-electrode 2142 may be provided in line shapes. The first sub-electrode 2141 may be disposed between neighboring second sub-electrodes 2142. The second sub-electrode 2142 may be disposed between neighboring first sub-electrodes 1141.

When the first sub-electrode 2141 and the second sub-electrode 2142 have polarities different from each other, the number of the electrodes may be different from each other. For example, when the first sub-electrode 2141 is configured to be an n-electrode and the second sub-electrode 2142 be a p-electrode, the number of the second sub-electrodes 2142 may be more. When an electrical conductivity and/or resistance of the second conductive semiconductor layer 2113 and the first conductive semiconductor layer 2111 are different from each other, electrons injected into the light emitting structure 2110 may be balanced with positive holes by the first sub-electrode 2141 and the second sub electrode 1142, thus optical characteristics of the light emitting device may be improved.

Meanwhile, polarities of a first sub-electrode 2141 and a second sub-electrode 2142 may be opposite to each other depending on characteristics required in the light emitting device package to which the light emitting device according to the embodiment is applied. In addition, the width, length, shape, and number of the first sub-electrode 2141 and the second sub-electrode 2142 may be variously modified according to the characteristics required in the light emitting device package.

The first sub-electrode 2141 and the second sub-electrode 2142 may be provided with a structure having a single layer or multiple layers. For example, the first sub-electrode 2141 and the second sub-electrode 2142 may be ohmic electrodes. For example, the first sub-electrode 2141 and the second sub-electrode 2142 may include at least one or an alloy formed of at least two of ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf.

As shown in FIGS. 14 and 15, the light emitting device 2100 according to the embodiment may include a protective layer 2150.

The protective layer 2150 may include third openings h3 for exposing the second sub-electrode 2142. The third openings h3 may be disposed corresponding to PB regions provided in the second sub-electrode 2142.

In addition, the protective layer 2150 may include fourth openings h4 for exposing the first sub-electrode 2141. The fourth openings h4 may be disposed corresponding to NB regions provided in the first sub-electrode 2141.

The protective layer 2150 may be disposed on the reflective layer 2160. The protective layer 2150 may be disposed on the first reflective layer 2161, the second reflective layer 2162, and the third reflective layer 2163.

For example, the protective layer 2150 may be provided as an insulating material. For example, the protective layer 2150 may be formed of at least one material selected from the group including SixOy, SiOxNy, SixNy, and AlxOy.

As shown in FIGS. 14 and 15, the light emitting device 2100 according to the embodiment may include the first bonding part 2171 and the second bonding part 2172 disposed on the protective layer 2150.

The first bonding part 2171 may be disposed on the first reflective layer 2161. In addition, the second bonding part 2172 may be disposed on the second reflective layer 2162. The second bonding part 2172 may be spaced apart from the first bonding part 2171.

The first bonding part 2171 may make contact with an upper surface of the first sub-electrode 2141 through the fourth openings h4 provided in the protective layer 2150 in the NB regions. The NB regions may be vertically offset with the second opening h2. When the plurality of NB regions and the second opening h2 are vertically offset from each other, a current injected into the first bonding part 2171 may be uniformly distributed in a horizontal direction of the first sub-electrode 2141, thus the current may be uniformly injected in the NB regions.

In addition, the second bonding part 2172 may make contact with an upper surface of the second sub-electrode 2142 through the third openings h3 provided in the protective layer 2150 in the PB regions. When the PB regions and the first openings h1 are not vertically overlapped with each other, a current injected into the second bonding part 2172 may be uniformly distributed in a horizontal direction of the second sub-electrode 2142, thus the current may be uniformly injected in the PB regions.

Thus, according to the light emitting device 2100 of the embodiment, the first bonding part 2171 may make contact with the first sub-electrode 2141 in the fourth openings h4. In addition, the second bonding part 2172 may make contact with the second sub-electrode 2142 in the multiple regions. Thus, according to the embodiment, because the power may be supplied through the regions, a current dispersion effect can be generated and an operating voltage can be reduced according to the increase of a contact area and the dispersion of a contact region.

In addition, according to the light emitting device 2100 of the embodiment, as shown in FIG. 13, the first reflective layer 2161 is disposed under the first sub-electrode 2141 and the second reflective layer 2162 is disposed under the second sub-electrode 2142. Accordingly, the first reflective layer 2161 and the second reflective layer 2162 reflect light emitted from the active layer 2112 of the light emitting structure 2110 to minimize the optical absorption in the first sub-electrode 2141 and the second sub-electrode 2142, so that light intensity Po can be improved.

For example, the first reflective layer 2161 and the second reflective layer 2162 may be formed of an insulating material, and have a structure such as a DBR structure using a material having high reflectivity so as to reflect the light emitted from the active layer 2112.

The first reflective layer 2161 and the second reflective layer 2162 may have a DBR structure in which materials having different refractive indexes are alternately disposed. For example, the first reflective layer 2161 and the second reflective layer 2162 may be disposed in a single layer or a stacked structure including at least one of $TiO_2$, $SiO_2$, $Ta_2O_5$, and $HfO_2$.

Without the limitation thereto, according to another embodiment, the first reflective layer 2161 and the second reflective layer 2162 may freely selected to adjust the reflectivity to the light emitted from the active layer 2112 according to a wavelength of the light emitted from the active layer 2112.

In addition, according to another embodiment, the first reflective layer 2161 and the second reflective layer 2162 may be provided as the ODR layer. According to still another embodiment, the first reflective layer 2161 and the second reflective layer 2162 may be provided as a sort of hybrid type in which the DBR layer and the ODR layer are stacked.

When the light emitting device according to the embodiment is implemented as a light emitting device package after being mounted by a flip chip bonding scheme, light provided from the light emitting structure 2110 may be emitted through the substrate 2105. The light emitted from the light emitting structure 2110 may be reflected by the first reflective layer 2161 and the second reflective layer 2162 and emitted toward the substrate 2105.

In addition, the light emitted from the light emitting structure 2110 may be emitted in the lateral direction of the light emitting structure 2110. In addition, the light emitted from the light emitting structure 2110 may be emitted to the outside through a region where the first bonding part 2171 and the second bonding part 2172 are not provided among surfaces on which the first bonding part 2171 and the second bonding part 2172 are disposed.

Specifically, the light emitted from the light emitting structure 2110 may be emitted to the outside through a region where the third reflective layer 2163 is not provided among the surfaces on which the first bonding part 2171 and the second bonding part 2172 are disposed.

Accordingly, the light emitting device 2100 according to the embodiment may emit the light in six-surfaced directions surrounding the light emitting structure 2110, and remarkably improve the light intensity.

Meanwhile, according to the light emitting device of the embodiment, when viewed from the top of the light emitting device 2100, the sum of the areas of the first bonding part 2171 and the second bonding part 2172 is less than or equal to 60% of the total area of the upper surface of the light emitting device 2100 on which the first bonding part 2171 and the second bonding part 2172 are disposed.

For example, the total area of the upper surface of the light emitting device 2100 may correspond to the area defined by a lateral length and a longitudinal length of the lower surface of the first conductive semiconductor layer 2111 of the light emitting structure 2110. In addition, the total area of the upper surface of the light emitting device 2100 may correspond to the area of an upper surface or a lower surface of the substrate 2105.

Accordingly, the sum of the areas of the first bonding part 2171 and the second bonding part 2172 is equal to or less than 60% of the total area of the light emitting device 2100, so that the amount of light emitted to the surface on which the first bonding part 2171 and the second bonding part 2172 are disposed may be increased. Thus, according to the embodiment, because the amount of the light emitted in the six-surfaced directions of the light emitting device 2100 is increased, the light extraction efficiency may be improved and the light intensity Po may be increased.

In addition, when viewed from the top of the light emitting device, the sum of the areas of the first bonding part 2171 and the second bonding part 2172 is equal to or greater than 30% of the total area of the light emitting device 2100.

Accordingly, the sum of the areas of the first bonding part 2171 and the second bonding part 2172 is equal to or greater than 30% of the total area of the light emitting device 2100, so that a stable mount may be performed through the first bonding part 2171 and the second bonding part 2172, and electrical characteristics of the light emitting device 2100 may be ensured.

The sum of the areas of the first bonding part 2171 and the second bonding part 2172 may be selected as 30% to 60% with respect to the total area of the light emitting device 2100 in consideration of ensuring the light extraction efficiency and the bonding stability.

In other words, when the sum of the areas of the first bonding part 2171 and the second bonding part 2172 is 30% to 100% with respect to the total area of the light emitting device 2100, the electrical characteristics of the light emitting device 2100 may be ensured and bonding strength to be mounted on the light emitting device package may be ensured, so that stable mount may be performed.

In addition, when the sum of the areas of the first bonding part 2171 and the second bonding part 2172 is more than 0% and equal to or less than 60% of the total area of the light emitting device 2100, the amount of light emitted to the surface on which the first bonding part 2171 and the second bonding part 2172 are disposed increases, so that the light extraction efficiency of the light emitting device 2100 may be improved and the light intensity Po may be increased.

In the embodiment, the sum of the areas of the first bonding part 2171 and the second bonding part 2172 is selected as 30% to 60% of the total area of the light emitting device 2100 so as to ensure the electrical characteristics of the light emitting device 2100 and the bonding strength to be mounted on the light emitting device package and increase the light intensity.

In addition, according to the light emitting device 2100 of the embodiment, the third reflective layer 2163 may be disposed between the first bonding part 2171 and the second bonding part 2172. For example, the length W5 of the third reflective layer 2163 in major axial direction of the light emitting device 2100 may correspond to the distance between the first bonding part 2171 and the second bonding part 2172. In addition, for example, the area of the third reflective layer 2163 may be 10% to 25% of the entire upper surface of the light emitting device 2100.

When the area of the third reflective layer 2163 is 10% or more of the entire upper surface of the light emitting device 2100, the package body disposed under the light emitting device may be prevented from being discolored or cracked. When being 25% or less, it is advantageous to ensure the light extraction efficiency for emitting light to six surfaces of the light emitting device.

In addition, without limited thereto in another embodiment, the area of the third reflective layer 2163 may be arranged to more than 0% and less than 10% of the entire upper surface of the light emitting device 2100 to ensure the light extraction efficiency more, and the area of the third reflective layer 2163 may be arranged to more than 25% and less than 100% of the entire upper surface of the light emitting device 2100 to prevent the package body from being discolored or cracked.

In addition, the light generated from the light emitting structure 2110 may be transmitted and emitted through a second region provided between a side surface arranged in the major axial direction and the first bonding part 2171 or the second bonding part 2172 adjacent to the side surface.

In addition, the light generated from the light emitting structure 2110 may be transmitted and emitted through a third region provided between a side surface arranged in a minor axial direction and the first bonding part 2171 or the second bonding part 2172 adjacent to the side surface.

According to the embodiment, the size of the first reflective layer 2161 may be several micrometers larger than the size of the first bonding part 2171. For example, the area of the first reflective layer 2161 may be provided in a size to completely cover the area of the first bonding part 2171. In consideration of a process error, for example, the length of one side of the first reflective layer 2161 may be greater than the length of one side of the first bonding part 2171 by about 4 micrometers to about 10 micrometers.

In addition, the size of the second reflective layer 2162 may be several micrometers larger than the size of the second bonding part 2172. For example, the area of the second reflective layer 2162 may be provided in a size to completely cover the area of the second bonding part 2172. In consideration of a process error, for example, the length of one side of the second reflective layer 2162 may be greater than the length of one side of the second bonding part 2172 by about 4 micrometers to about 10 micrometers.

According to the embodiment, light emitted from the light emitting structure 2110 may be reflected without being incident on the first bonding part 2171 and the second bonding part 2172 by the first reflective layer 2161 and the second reflective layer 2162. Thus, according to the embodiment, a loss of the light generated and emitted from the light emitting structure 2110 and incident to the first bonding part 2171 and the second bonding part 2172 may be minimized.

In addition, according to the light emitting device 2100 of the embodiment, because the third reflective layer 2163 is disposed between the first bonding part 2171 and the second bonding part 2172, the amount of light emitted between the first bonding part 2171 and the second bonding part 2172 may be adjusted.

As described above, the light emitting device 2100 according to the embodiment may be provided as a light emitting device package after being mounted, for example, in a flip chip bonding scheme. Herein, when the package body mounted thereon with the light emitting device 2100 is provided with resin or the like, the package body is discolored or cracked in the lower region of the light emitting device 2100 due to strong short-wavelength light emitted from the light emitting device 2100.

However, according to the light emitting device 2100 of the embodiment, because the amount of light emitted between the region on which the first bonding part 2171 and the second bonding part 2172 are disposed is adjusted, the package body disposed in the lower region of the light emitting device 2100 may be prevented from being discolored or cracked.

According to the embodiment, the light generated from the light emitting structure 1100 may be transmitted and emitted through 20% or more of the area of the upper surface of the light emitting device 2100 on which the first bonding part 2171, the second bonding part 2172 and the third reflective layer 2163.

Thus, according to the embodiment, because the amount of the light emitted in the six-surfaced directions of the light emitting device 2100 is increased, the light extraction efficiency may be improved and the light intensity Po may be increased. In addition, the package body disposed adjacent to the lower surface of the light emitting device 2100 may be prevented from being discolored or cracked.

In addition, according to the light emitting device 2100 of the embodiment, a plurality of contact holes C1, C2, and C3 may be provided in the transparent electrode layer 2130. The second conductive semiconductor layer 2113 may be bonded to the reflective layer 2160 through the plurality of contact holes C1, C2, and C3 provided in the transparent electrode layer 2130. The reflective layer 2160 makes directly contact with the second conductive semiconductor layer 2113, so that the adhesive strength may be improved as compared with the case that the reflective layer 2160 makes contact with the transparent electrode layer 2130.

When the reflective layer 2160 makes direct contact with only the transparent electrode layer 2130, the bonding strength or adhesive strength between the reflective layer 2160 and the transparent electrode layer 2130 may be weakened. For example, when an insulating layer is bonded to a metal layer, the bonding strength or adhesive strength between the materials thereof may be weakened.

For example, when the bonding strength or adhesive strength between the reflective layer 2160 and the transparent electrode layer 2130 is weak, peeling may incur between the two layers. Thus, when the peeling incurs between the reflective layer 2160 and the transparent electrode layer 2130, the characteristics of the light emitting device 2100 may deteriorate and the reliability of the light emitting device 2100 may not be ensured.

However, according to the embodiment, because the reflective layer 2160 can make direct contact with the second conductive semiconductor layer 2113, the bonding strength and adhesive strength may be stably provided between the reflective layer 2160, the transparent electrode layer 2130, and the second conductive semiconductor layer 2113.

Thus, according to the embodiment, because the bonding strength between the reflective layer 2160 and the second conductive semiconductor layer 2113 may be stably provided, the reflective layer 2160 may be prevented from being peeled off from the transparent electrode layer 2130. In addition, because the bonding strength between the reflective layer 2160 and the second conductive semiconductor layer 2113 may be stably provided, the reliability of the light emitting device 2100 may be improved.

Meanwhile, as described above, the transparent electrode layer 2130 may be provided with the contact holes C1, C2, and C3. The light emitted from the active layer 2112 may be incident to and reflected by the reflective layer 2160 through the contact holes C1, C2, and C3 provided in the transparent electrode layer 2130. Accordingly, the loss of the light generated from the active layer 2112 and incident to the transparent electrode layer 2130 is reduced, so that the light extraction efficiency may be improved. Thus, according to the light emitting device 2100 of the embodiment, the light intensity may be improved.

Hereinafter, an example of the flip chip light emitting device applied to the light emitting device package according to the embodiment of the present invention will be described with reference to FIG. 16 and FIG. 17.

FIG. 16 is a plan view describing an electrode arrangement of the light emitting device applied to the light emitting device package according to the embodiment of the present invention, and FIG. 16 is a sectional view taken along the line F-F of the light emitting device shown in FIG. 15.

Meanwhile, for better understanding, FIG. 16 conceptually shows only the relative arrangement of the first electrode 127 and the second electrode 128. The first electrode 127 may include the first bonding part 121 and a first branched electrode 125. The second electrode 128 may include the second bonding part 122 and a second branched electrode 126.

As shown in FIGS. 16 and 17, the light emitting device according to the embodiment may include a light emitting structure 123 disposed on the substrate 124.

The substrate 124 may be selected from the group including a sapphire substrate ($Al_2O_3$), SiC, GaAs, GaN, ZnO, Si, GaP, InP and Ge. For example, the substrate 124 may be provided as a patterned sapphire substrate (PSS) formed on an upper surface thereof with a concavo-convex pattern.

The light emitting structure 123 may include a first conductive semiconductor layer 123aa, an active layer 123b, and a second conductive semiconductor layer 123c. The active layer 123b may be disposed between the first conductive semiconductor layer 123a and the second conductive semiconductor layer 123c. For example, the active layer 123b may be disposed on the first conductive semiconductor layer 123a, and the second conductive semiconductor layer 123c may be disposed on the active layer 123b.

According to the embodiment, the first conductive semiconductor layer 123a may be provided as an n-type semiconductor layer, and the second conductive semiconductor layer 123c may be provided as a p-type semiconductor layer. According to another embodiment, the first conductive semiconductor layer 123a may be provided as a p-type semiconductor layer, and the second conductive semiconductor layer 123c may be provided as an n-type semiconductor layer.

As shown in FIGS. 16 and 17, the light emitting device according to the embodiment may include the first electrode 127 and the second electrode 128.

The first electrode 127 may include the first bonding part 121 and a first branched electrode 125. The first electrode 127 may be electrically connected to the second conductive semiconductor layer 123c. The first branched electrode 125 may be branched from the first bonding part 121. The first branched electrode 125 may include a plurality of branched electrodes branched from the first bonding part 121.

The second electrode 128 may include the second bonding part 122 and a second branched electrode 126. The second electrode 128 may be electrically connected to the first conductive semiconductor layer 123a. The second branched electrode 126 may be branched from the second bonding part 122. The second branched electrode 126 may include a plurality of branched electrodes branched from the second bonding part 122.

The first branched electrode 125 and the second branched electrode 126 may be alternately arranged to each other in a finger shape. The power supplied through the first bonding part 121 and the second bonding part 122 may spread to the entire light emitting structure 123 by the first branched electrode 125 and the second branched electrode 126.

The first electrode 127 and the second electrode 128 may have a single-layer or multi-layer structure. For example, the first electrode 127 and the second electrode 128 may be ohmic electrodes. For example, the first electrode 127 and the second electrode 128 may include at least one or an alloy formed of at least two of ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf.

Meanwhile, the light emitting structure 123 may further include a protective layer. The protective layer may be provided on an upper surface of the light emitting structure 123. In addition, the protective layer may be provided on a side surface of the light emitting structure 123. The protective layer may be provided to exposure the first bonding part 121 and the second bonding part 122. In addition, the protective layer may be selectively provided on a periphery and a lower surface of the substrate 124.

For example, the protective layer may be provided as an insulating material. For example, the protective layer may be formed of at least one material selected from the group including $Si_xO_y$, $SiO_xN_y$, $Si_xN_y$, and $Al_xO_y$.

In the light emitting device according to the embodiment, light generated in the active layer 123b may be emitted in six-surfaced directions of the light emitting device. The light generated in the active layer 123b may be emitted in six-surfaced directions through an upper surface, a lower surface, and four side surfaces of the light emitting device.

For reference, the vertical direction of the light emitting device described with reference to FIGS. 1 to 13 and the vertical direction of the light emitting device shown in FIGS. 16 and 17 are shown opposite to each other.

According to the embodiment, the sum of the areas of the first and second bonding parts 121 and 122 may be 10% or less based on the area of the upper surface of the substrate 124. According to the light emitting device package of the embodiment, the sum of the areas of the first and second bonding parts 121 and 122 may be 10% or less based on the area of the substrate 124 to increase the light extraction efficiency by ensuring the light emitting area from the light emitting device.

In addition, according to the embodiment, the sum of the areas of the first and second bonding parts 121 and 122 may be 0.7% or more based on the area of the upper surface of the substrate 124. According to the light emitting device package of the embodiment, the sum of the areas of the first and second bonding parts 121 and 122 may be 0.7% or more based on the area of the upper surface of the substrate 124.

For example, the width of the first bonding part 121 in a long axis direction of the light emitting device may be tens of micrometers. The width of the first bonding part 121 may be in the range of 70 micrometers to 90 micrometers. In addition, the area of the first bonding part 121 may be thousands of square micrometers.

In addition, the width of the second bonding part 122 in the long axis direction of the light emitting device may be tens of micrometers. The width of the second bonding part 122 may be in the range of 70 micrometers to 90 micrometers. In addition, the area of the second bonding part 122 may be thousands of square micrometers.

Accordingly, when the area of the first and second bonding parts 121 and 122 is reduced, the amount of light transmitted to the lower surface of the light emitting device 120 may be increased.

According to the embodiments, it is possible to provide a light emitting device package, a method of manufacturing a light emitting device package, and a light source unit capable of greatly improving luminance by uniformly disposing the reflection layer around a light emitting device in a light emitting device package.

The semiconductor device package and the method of manufacturing the semiconductor device package according to the embodiment can improve light extraction efficiency, electrical characteristics and reliability.

The semiconductor device package and the method of manufacturing the semiconductor device package according to the embodiment can improve the process efficiency and propose a new package structure, thereby reducing manufacturing cost and improving manufacturing yield.

According to embodiments, the semiconductor device package is provided with a body having high reflectance, so that a reflector can be prevented from being discolored, thereby improving reliability of the semiconductor device package.

According to embodiments, the semiconductor device package and the method of manufacturing a semiconductor device can prevent a re-melting phenomenon from occurring in a bonding region of the semiconductor device package during a process of re-bonding the semiconductor device package to a substrate or the like.

INDUSTRIAL APPLICABILITY

The light emitting device package according to the embodiment may be applied to the light source apparatus.

Further, the light source apparatus may include a display apparatus, a lighting apparatus, a head lamp, and the like based on the industrial field.

As an example of the light source apparatus, the display apparatus includes a bottom cover, a reflective plate disposed on the bottom cover, a light emitting module emitting light and including a light emitting device, a light guide plate disposed on a front of the reflective plate and guiding light emitted from the light emitting module, an optical sheet including prism sheets disposed in front of the light guide plate, a display panel disposed in front of the optical sheet, an image signal output circuit connected to the display panel and supplying an image signal to the display panel, and a color filter disposed in front of the display panel. Herein, the bottom cover, the reflective plate, the light emitting module, the light guide plate, and the optical sheet may form a backlight unit. In addition, the display apparatus may have a structure in which light emitting devices each emitting red, green, and blue light are disposed without including the color filter.

As another example of the light source apparatus, the head lamp may include a light emitting module including a light emitting device package disposed on a substrate, a reflector for reflecting light emitted from the light emitting module in a predetermined direction, for example, in a forward direction, a lens for forwardly refracting the light, and a shade for blocking or reflecting a portion of the light reflected by the reflector and directed to the lens to form a light distribution pattern desired by a designer.

The lighting apparatus as another light source apparatus may include a cover, a light source module, a heat sink, a power supply, an inner case, and a socket. In addition, the light source apparatus according to an embodiment may further include at least one of a member and a holder. The light source module may include a light emitting device package according to the embodiment.

The features, structures, effects and the like described in the above embodiments are included in at least one embodiment and are not limited to one embodiment only. Further, with respect to the features, structures, effects, and the like described in the embodiments, other embodiments may be carried out with combinations or modifications by those having ordinary skill in the art. Accordingly, the contents relevant to the combinations and modifications should be construed as being included in the scope of the embodiments.

Although preferable embodiments have been proposed and set forth in the aforementioned description, the present invention should not be construed as limited thereto. It will be apparent that various deformations and modifications not illustrated are available within the scope without departing from inherent features of the embodiment of the present invention by any one having ordinary skill in the art. For example, each component specifically shown in the embodiments may be carried out with the modifications. In addition, it is apparent that differences relevant to the modifications and deformations are included in the scope of the embodiments set in the accompanying claims of the present invention.

DESCRIPTION OF REFERENCE NUMERALS frames 111, 112, body 113, package body 110
bonding parts 121, 122, light emitting device 120
reflective resin layer 170, transparent resin layer 160, phosphor layer 180

The invention claimed is:

1. A light emitting device package comprising:
a first frame including a first through-hole;
a second frame spaced apart from the first frame and including a second through-hole;
a body supporting the first and second frames and including a cavity;
a light emitting device disposed in the cavity;
an adhesion layer disposed between the body and the light emitting device;
a reflection layer disposed on a side surface of the cavity;
a transparent layer disposed on the reflection layer and surrounding the light emitting device; and
a phosphor layer disposed on the transparent layer,
wherein the first and second through-holes overlap the light emitting device,
the body includes a recess between the first and second through-holes, and
the adhesion layer is disposed in the recess.

2. The light emitting device package of claim 1, wherein the transparent layer comprises a transparent resin layer.

3. A lighting apparatus comprising a light emitting unit including the light emitting device package claimed in claim 2.

4. The light emitting device package of claim 1, wherein the reflection layer comprises a reflective resin layer.

5. A lighting apparatus comprising a light emitting unit including the light emitting device package claimed in claim 4.

6. A lighting apparatus comprising a light emitting unit including the light emitting device package claimed in claim 1.

7. A light emitting device package comprising:
a package body including a frame and a body;
a light emitting device including first and second bonding parts and disposed on the body;
a reflective resin layer disposed between the light emitting device and a side surface of a cavity formed in the body;
a transparent resin layer on the light emitting device; and
a phosphor layer disposed on the transparent resin layer while being spaced apart from the light emitting device.

8. The light emitting device package of claim 7, wherein the transparent resin layer comprises a first transparent layer disposed between the light emitting device and the phosphor layer.

9. The light emitting device package of claim 8, wherein the transparent resin layer comprises a second transparent layer disposed between the reflective resin layer and the light emitting device.

10. A lighting apparatus comprising a light emitting unit including the light emitting device package claimed in claim 9.

11. The light emitting device package of claim 8, wherein the reflective resin layer comprises:
a first reflective resin layer disposed on the light emitting device and a side surface of the cavity; and
a second reflective resin layer disposed between first and second bonding parts of the light emitting device and the body.

12. A lighting apparatus comprising a light emitting unit including the light emitting device package claimed in claim 11.

13. A lighting apparatus comprising a light emitting unit including the light emitting device package claimed in claim 8.

14. A lighting apparatus comprising a light emitting unit including the light emitting device package claimed in claim 7.

* * * * *